United States Patent
Beausoleil et al.

(10) Patent No.: US 8,335,434 B2
(45) Date of Patent: Dec. 18, 2012

(54) ALL OPTICAL FAST DISTRIBUTED ARBITRATION IN A COMPUTER SYSTEM DEVICE

(75) Inventors: Raymond G. Beausoleil, Redmond, WA (US); Marco Fiorentino, Mountain View, CA (US); Norman Paul Jouppi, Palo Alto, CA (US); Nathan Lorenzo Binkert, Redwood City, CA (US); Robert Samuel Schreiber, Palo Alto, CA (US); Qianfan Xu, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 229 days.

(21) Appl. No.: 12/682,918

(22) PCT Filed: Oct. 23, 2008

(86) PCT No.: PCT/US2008/012119
§ 371 (c)(1),
(2), (4) Date: Apr. 14, 2010

(87) PCT Pub. No.: WO2009/055032
PCT Pub. Date: Apr. 30, 2009

(65) Prior Publication Data
US 2010/0226657 A1    Sep. 9, 2010

Related U.S. Application Data

(60) Provisional application No. 61/000,190, filed on Oct. 23, 2007.

(51) Int. Cl.
*H04B 10/20* (2006.01)
*H04B 10/04* (2006.01)
*H04J 14/02* (2006.01)

(52) U.S. Cl. ............ 398/89; 398/58; 398/141; 398/182; 398/200

(58) Field of Classification Search .................. 398/33, 398/45, 141, 164, 182, 200, 58, 89
See application file for complete search history.

(56) References Cited

U.S. PATENT DOCUMENTS

| 6,477,286 | B1 | 11/2002 | Ouchi |
| 7,224,859 | B2 | 5/2007 | Hoshino et al. |
| 7,636,522 | B2 * | 12/2009 | Nagarajan et al. ............. 398/79 |
| 7,752,400 | B1 * | 7/2010 | Young .......................... 711/158 |

(Continued)

FOREIGN PATENT DOCUMENTS

CN    1661400 A    8/2005

(Continued)

OTHER PUBLICATIONS

Keren Bergman et al., On-Chip Photonic Communications for High Performance Multi-core Processors, HPEC 2007 Proceedings, Presentation, pp. 1-32, Lexington, MA. (Sep. 18-20, 2007).

(Continued)

*Primary Examiner* — Dalzid Singh

(57) ABSTRACT

Various embodiments of the present invention are directed to systems and methods for all optical distributed arbitration for computer system components (1801-1804) communicatively coupled via a photonic interconnect in a computer system device. The embodiments of the optical arbitration in the computer system provides arbitration schemes with fixed priority (2000) and non-fixed priority (1830, 2200). The non-fixed priority scheme embodiments can provide fairness in arbitration. In some embodiments, delivery of light power and arbitration are combined (1830, 2001).

10 Claims, 24 Drawing Sheets

U.S. PATENT DOCUMENTS

| | | | | |
|---|---|---|---|---|
| 2003/0128980 | A1* | 7/2003 | Abeles | 398/48 |
| 2006/0038168 | A1* | 2/2006 | Estes et al. | 257/25 |
| 2006/0161875 | A1 | 7/2006 | Rhee | |
| 2009/0304327 | A1* | 12/2009 | Green et al. | 385/16 |

FOREIGN PATENT DOCUMENTS

| | | |
|---|---|---|
| JP | 4-291317 | 10/1992 |
| JP | 8-046593 | 2/1996 |

OTHER PUBLICATIONS

Keren Bergman et al., On-Chip Photonic Communications for High Performance Multi-core Processors, HPEC 2007 Proceedings, Abstract, pp. 1-2, Lexington, MA. (Sep. 18-20, 2007).

On-Chip Photonic Communications for High Performance Multi-Core Processors, Sep. 20, 2007.

Office Action received in related CN case; Application No. 200880122362.0, mailed Jun. 22, 2011, pp. 4.

Translation of CN Office Action; Application No. 200880122362.0, mailed Jun. 22, 2011, pp. 8.

Office Action received in related JP case; Application No. 2010-531049, mailed Oct. 4, 2011, pp. 2.

N. McKeown. The iSLIP scheduling algorithm for input-queued switches. IEEE/ACM Trans. Netw., 7(2):188-201, 1999.

M. Karol, M. Hluchyj, and S. Morgan. Input versus output queueing on a space-division packet switch. Communications, IEEE Transactions on, 35(12):1347-1356, 1987.

J. Pierce. How far can data loops go? IEEE Transactions on Communications 20(3):527-530, Jun. 1972.

Y. Tamir and G. L. Frazier. high-performance Multi-Queue Buffers for VLSI Communications Switches. SIGARCH Computer Architecture News, 16(2):343-354, 1988.

P. Krishnarnurthy, M. Franklin, and R. Chamberlain. Dynamic reconfiguration of an optical interconnect. In ANSS '03, p. 89, Washington. DC, USA, 2003. IEEE Computer Society.

A. Kodi and A. Louri. Design of a high-speed optical interconnect for scalable shared memory multiprocessors. In High Performance Interconnects, 2004. Proceedings. 12th Annual IEEE Symposium on, pp. 92-97, 2004.

C Minkenberg, F. Abel, P. Muller, R. Krishnamurthy, M. Gusat, P. Dill, I. Iliadis, R. Luijten, B. R. Hemenway, R. Grzybowski, and E. Schiattarella. Designing a crossbar scheduler for hpc applications. IEEE Micro, 26(3):58-71, 2006.

A. Falcon, P. Faraboschi, and D. Ortega. Combining Simulation and Virtualization through Dynamic Sampling. In ISPASS, Apr. 2007.

M. A. Marsan, A. Bianco, E. Leonardi, A. Morabito, and F. Neri. All-optical WDM multi-rings with differentiated QoS. IEEE Communications Magazine, 37(2):58-66, 1999.

J.-H. Ha and T. M. Pinkston. A new token-based channel access protocol for wavelength division multiplexed multiprocessor interconnects. Journal of Parallel Distributed Computing, 60(2):169-188, 2000.

C. Qiao and R. G. Melhem. Time-division optical communications multiprocessor arrays. In SC '91, pp. 644-653, New York, NY, USA, 1991. ACM.

S. C. Woo, M. Ohara, E. Torrie, J. P. Singh, and A. Gupta. The SPLASH-2 Programs: Characterization and Methodological Considerations. In ISCA, pp. 24-36, Jun. 1995.

Q. Xu, D. Fattal, and R. Beausoleil. Silicon microring resonators with 1.5-$\mu$m radius. Optics Express, 16(6):4309-4315, 2008.

A. Shacham, B. G. Lee, A. Biberman, K. Bergman, and L. P. Carloni. Photonic NoC for DMA Communications in Chip Multiprocessors. In Proceedings of Hot Interconnects, pp. 29-35, Aug. 2007.

A. Kodi and A. Louri. Performance adaptive power-aware reconfigurable optical interconnects for high-performance computing (hpc) systems. In SC '07: Proceedings of the 2007 ACM/IEEE conference on Supercomputing, pp. 1-12, New York, NY, USA, 2007. ACM.

Q. Xu, B. Schmidt, S. Pradhan, and M. Lipson. Micrometre-scale silicon electro-optic modulator. Nature, 435:325, May 2005.

I. Cidon and Y. Ofek. Metaring—a full-duplex ring with fairness and spatial reuse. IEEE Transactions on Communications, 41(1):110-120, 1993.

N. L. Binkert, R. G. Dreslinski, L. R. Hsu, K. T. Lim, A. G. Saidi, and S. K. Reinhardt. The M5 Simulator: Modeling Networked Systems. IEEE Micro, 26(4):52-60, Jul./Aug. 2006.

K. Bogineni, K. M. Sivalingam, and P. W. Dowd. low-complexity multiple access protocols for wavelength-division multiplexed photonic networks. IEEE Journal on Selected Areas in Communications, 11:590-604, 1993.

ANSI/IEEE. Local Area Networks: Token Ring Access Method and Physical Layer Specifications, Std 802.5. Technical report, 1989.

N. Kirman, M. Kirman, R. K. Dokania, J. F. Martinez, A. B. Apsel, M. A. Watkins, and D. H. Albonesi. Leveraging Optical Technology in Future Bus-based Chip Multiprocessors, In MICRO'06. pp. 492-503, Washington, DC, USA, 2006. IEEE Computer Society.

L. Zhang, M. Song, T. Wu, L. Zou, R. G. Beausoleil, and A. E. Willner. Embedded ring resonators microphotonic applications. Optics Letters, 33(7):1978-1980, 2008.

S. S. Mukherjee, F. Silla, P. Bannon, J. Emer, S. Lang, and D. Webb. A comparative study of arbitration algorithms for the alpha 21364 pipelined router. SIGOPS, 36(5):223-234, 2002.

\* cited by examiner

ALL OPTICAL FAST DISTRIBUTED ARBITRATION IN A COMPUTER SYSTEM DEVICE

CROSS-REFERENCE TO RELATED APPLICATIONS

This application is a National Stage application of International Application No. PCT/US2008/012119, filed Oct. 23, 2008, which claims the benefit of U.S. Provisional Application No. 61/000,190, filed Oct. 23, 2007, the disclosures of which are hereby incorporated by reference in their entirety.

TECHNICAL FIELD

Embodiments of the present invention are directed to arbitration for resources in a computer system device, in particular arbitration for optical channels in a photonic interconnect providing communication between computer system components in the computer system device.

BACKGROUND

In the mid 1960's, semiconductor manufacturers observed that the density of circuits, such as transistors, fabricated on integrated circuits was doubling about every 18 months. This trend has continued and is now termed "Moore's Law." The transistor density is viewed as a rough measure of computer processing power, which, in turn, corresponds to data processing speed. Although Moore's Law was originally made as an observation, over time Moore's Law has became widely accepted by the semiconductor industry as a fundamental driving force behind increasing computer processing power. As a result, semiconductor manufacturers have developed technologies for reducing the size of chip components to microscale and even nanoscale dimensions. Computer system architectures for computer systems (some examples of which are a memory module system, a single core processor device or a multi-core processor device) are encountering limitations while trying to keep up with Moore's law.

The multi-core system example illustrates some of the problems encountered. In recent years, the semiconductor industry has developed processors comprising two or more sub-processors, called "cores." For example, a dual-core processor contains two cores, and a quad-core processor contains four cores. Typically, the cores are integrated, share the same interconnects to the rest of the system, and can operate independently. Although semiconductor manufactures can increase the transistor density of a single core, semiconductor manufacturers have not moved in this direction due to inefficient power consumption. The alternative is to increase the number of cores packaged on a single die. A die is a single layer of semiconductor material on which an integrated circuit ("chip") is fabricated. However, on-chip and off-chip communication has emerged as a critical issue for sustaining performance growth for the demanding, data-intensive applications for which these multi-core chips are needed. Computational bandwidth scales linearly with the growing number of cores, but the rate at which data can be communicated across a multi-core chip using top-level metal wires is increasing at a much slower pace. In addition, the rate at which data can be communicated off-chip through pins located along the chip edge is also growing more slowly than compute bandwidth, and the energy cost of on-chip and off-chip communication significantly limits the achievable bandwidth. As a result, computer architecture is now at a cross roads and physicist and engineers are seeking alternatives to using metal wires for on-chip and off-chip communications.

Computer system components such as the cores on a chip communicate with each other over a common interconnect and share resources. One mechanism to avoid conflicts or collision is by using an arbitration mechanism by which the components can determine which gets access to the resource at any given time.

Arbitration for shared resources is critical for the performance of many systems, yet efficient arbitration among many requestors for a resource is often very slow relative to processor clock cycles. Furthermore, at high processor clock frequencies, arbitration can consume a great deal of power given a moderately complex electrical implementation.

Controlling N-input, N-output crossbars to assign a unique sender to each output port is a standard problem in computer networking. The usual hardware solutions are designed for systems with virtual output queues (VOQs), in which each sender has one VOQ per receiver. The best possible solution can be computed by an offline sequential algorithm in $O(N2.5)$ time by the Hoperoft-Karp algorithm for maximum matching in a bipartite graph, but this would be far too slow for use as a crossbar arbitration scheme. Instead, for electronically controlled network switch fabrics, an online, parallel, iterative scheme is used. In each round of a multi-round iterative process, senders request the right to send to receivers, an arbiter sends grants back in response to some of these requests, and some of the grants are then accepted. A maximal matching is achieved in $O(\log 2(N))$ rounds. The time required is typically measured in the tens of microseconds.

An arbitration scheme that can perform its task at a speed commensurate with the system in which it is operating to avoid becoming a bottleneck and which is low power is desired. Low complexity is also a desirable feature for an arbitration system.

SUMMARY

Various embodiments of the present invention are directed to systems and methods for all optical distributed arbitration for computer system components communicatively coupled via a photonic interconnect in a computer system device. The embodiments of the optical arbitration in the computer system provides arbitration schemes with fixed priority and non-fixed priority. The non-fixed priority scheme embodiments can provide fairness in arbitration. In some embodiments, delivery of light power and arbitration are combined.

DETAILED DESCRIPTION

Figure 1:
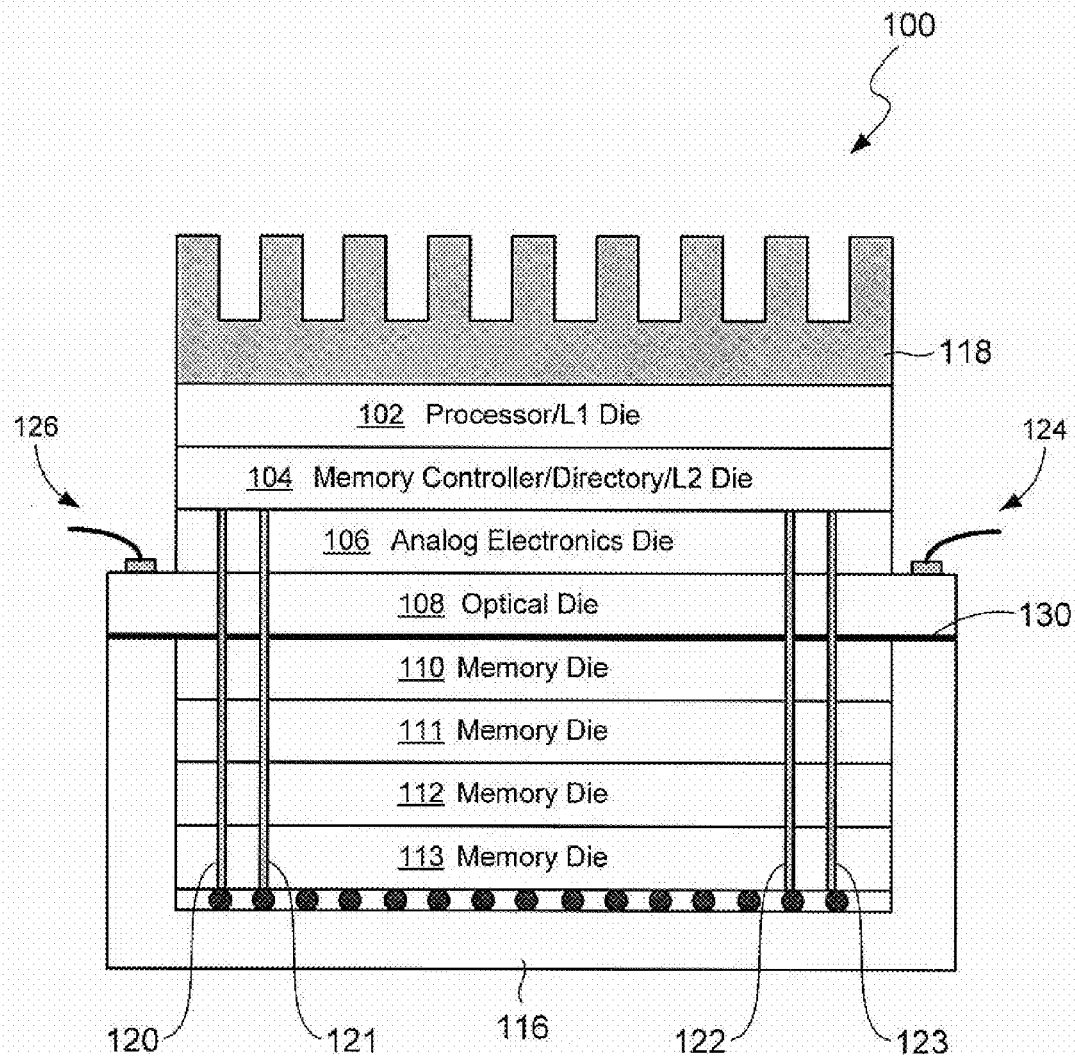
FIG. 1 shows a cross-sectional view of a stacked computational device in accordance with embodiments of the present invention.

Various embodiments of the present invention are directed to all optical arbitration systems and methods in the context of a photonic interconnect providing communication between computer system components. These photonic interconnects are faster than their electrical counterparts, so an arbitration system needs not to be a bottleneck. An all-optical arbitration system is desired so the arbitration can be performed commensurate with the speed of communication. For illustrative purposes, a computer system device embodiment is described to provide a context for illustrating various aspects of the arbitration system of the present invention. However, an all-optical arbitration system in accordance with the present invention is not limited to the specific details of the embodiments of a photonic interconnect as described.

Photonic Interconnect

These photonic interconnects provide on-chip photonic interconnections between computer system components (e.g., cores, clusters, memory controllers). Additionally, some embodiments of the photonic interconnect provide as well off-chip photonic interconnections to computer system components on external devices. Embodiments of the present invention also include photonic interconnects which have nanophotonic components which include components with dimensions that are typically less than a wavelength, or less than a micron.

These photonic interconnects provide a faster rate at which data can be communicated off-chip than conventional pins located along the chip edge, provide a larger computational bandwidth, provide a lower energy cost for on-chip and off-chip communications than conventional metal wires, and can be scaled up or down to accommodate additional components, for example, a processor having any number of cores. Architectures of the photonic interconnect can be implemented with non-blocking, low-latency, reconfigurable nanophotonic microrings, offering a high bandwidth, modest latency, and very low power consumption even at peak computational bandwidths. In addition, the architectures of the computer system devices can be configured so that all memory is in close proximity to a memory controller or even the processor. A multi-core based computational device employing optical dies configured in accordance with embodiments of the present invention may operate at about 20 Tbytes/s.

In the following description, the terms "photonic" and "photonically" refer to devices that operate with classical and/or quantized ER having wavelengths that are not limited to just the visible portion of the electromagnetic spectrum. In the various photonic switch and switch fabric embodiments described below, a number of structurally similar components comprising the same materials have been provided with the same reference numerals and, in the interest of brevity, an explanation of their structure and function is not repeated.

Multi-Core, Stacked Computational Devices

FIG. 1 shows a cross-sectional view of an exemplary computer system device ("computational device") 100 which is a multi-core, stacked computational device employing a photonic interconnect in accordance with embodiments of the present invention. The computational device 100 comprises a processor die 102, a memory controller/directory/L2 die ("memory-controller die") 104, an analog electronic die 106, an optical die 108, and four stacked memory dies 110-113 stacked in a package 116. The stacked memory dies 110-113 can be volatile memory, such as dynamic random access memory ("DRAM"), non-volatile memory, or any combination of volatile and non-volatile memory. In particular, the stacked memory dies 110-113 can be 8 gigabyte ("GB") DRAM. The computational device 100 also includes a heat sink 118 positioned on the top surface of the processor die 102, and a large number of vias (e.g., hundreds), represented by four through vias 120-123, that extend from the memory-controller die 104 through the analog electronic die 106 and the optical die 108 to the four memory dies 110-113.

The dies 102, 104, 106, 108, and 110-113 can range in thickness from approximately 25 to approximately 50 microns. The heat sink 118 dissipates heat produced by computational operation of the processor die 102, and the through vias 120-123 can be metalized or silicon filled vias that electrically interconnect memory controllers in the memory die to each of the four memory dies 110-113. The memory controllers located within the memory-controller die 104 manage the flow of data going to and from the memory dies 110-113 and the flow of data going to and from external devices (not shown). The optical die 108 is larger that the other dies in order to include external photonic interconnects, such as external photonic interconnects 124 and 126, that can be used to transmit data encoded electromagnetic radiation to and from the computational device 100. The optical die can be approximately 24 mm by 24 mm, but the dimensions can be varied depending on the implementation. A diamond layer 130 may also be included between the bottom surface of the optical die 108 and the top surface of the memory die 110. The diamond layer 130 can be approximately 1-10 μm thick and can be used to spread out and dissipate heat produced by the processor die 102 and the memory-controller die 104.

The three-dimensional die stacking shown in FIG. 1 permits tight coupling of the optical die 108 with the electronic dies 102 and 104, provides accessibility of the memory dies 110-113 at low latency, and, by spreading the cluster logic and memory over stacked adjacent dies 102, 104, and 110-113, the electrical intra-cluster wiring is shortened over conventional devices. In particular, stacking the memory dies in close proximity to the memory controllers and using vias running through the memory layers provides shorter-length, lower-resistance interconnections than the considerably longer, higher-resistance interconnections used to connect conventional memory to memory controllers. As a result, the power, or load, needed to transmit electrical signals between dies of the computational device 100 is significantly lower than the power needed for conventional memory to memory controllers.

Figure 2:
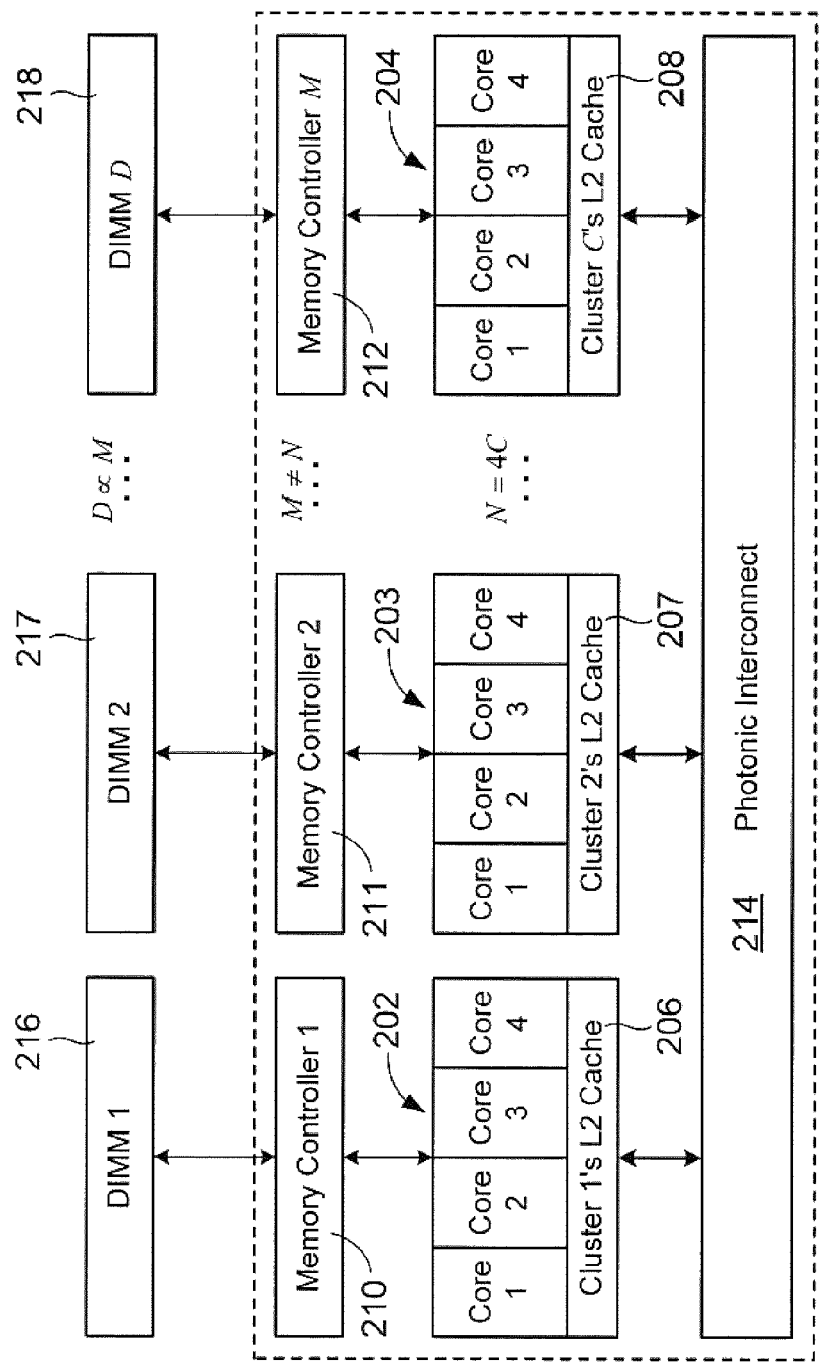
FIG. 2 shows a schematic representation of components of the computational device in accordance with embodiments of the present invention.

FIG. 2 shows a schematic representation of components of the dies 102, 104, and 108 of the computational device 100 interconnected in accordance with embodiments of the present invention. The processor die 102 is a multi-core processor where the cores can be arranged into clusters of four cores each, as represented by clusters 202-204. Each core has a private first level ("L1") instruction cache (not shown) and a private L1 data cache (not shown) described below with reference to FIG. 4. The clusters 202-204 each have a private shared second level ("L2") cache, represented by L2 caches 206-208, and an associated memory controller, represented by memory controllers 210-212. The memory controllers 210-212 control the flow of data to and from the clusters 202-204, respectively. The L2 caches and the memory controllers are located in the memory-controller die 104 adjacent to the processor die 102. As shown in FIG. 2, a photonic interconnect 214 of the optical die 108 provides photonic interconnections that enable the L2 caches 206-208 associated with the clusters 202-204 to photonically communicate with each other and with the memory controllers 210-212. Also, FIG. 2 reveals that the memory controllers 210-211 can photonically communicate with external memory modules, such as off-chip dual in-line memory modules ("DIMMs") 216-218. The clusters 202-204 can communicate electronically or photonically with the DIMMS 216-218, respectively.

Each cluster of the processor die 102 has a corresponding memory controller disposed on the memory controller die 104, each memory controller interfaces to the stacked memory dies 110-113 or drives a photonic connection to off-chip memory to provide bandwidth that scales with the processor die 102 performance. The clusters are also photonically coupled to each other through the optical die 108, offering high bandwidth, modest latency, and very low power consumption. Thus, a programmer with the stacked computational device 100 at his/her disposal can express parallelism at a high level, and is not burdened by issues of locality, which greatly reduces the difficulty of parallel program development. Furthermore, the computational device 100 architecture may provide bandwidth of one byte per flop to DRAM.

When 8 GB DRAM is selected for each of the memory dies 110-113, the on-stack memory provides 32 Gbytes of DRAM which is directly connected to the memory controllers through the multiple vias running through the DRAM, such as vias 120-123. The DRAM is provided by 4 memory stack layers, thinned to about 25 to 50 microns to minimize loading of, or the amount of power needed to use, the vias. Each layer of the DRAM stack includes 64 nearly identical regions which map onto the clusters in the processor die 102 above. Each DRAM region can be further subdivided into multiple banks that reduce the row access time, and allows multiple concurrent accesses. For example, using 20 nm DRAM technology each region may provide 1 Gbit of error correcting code protected storage, so that each memory controller in the memory-controller die 104 electronically connects to 0.5 Gbytes of memory. Multiple channels provide increased bandwidth into the memory. By providing increased bandwidth, bank conflicts in the DRAM are reduced. Each memory channel consists of 72 data bits and approximately 30 address and control bits. Using 25 micron pitch through vias the area overhead of the through vias may be less the 3% of the memory layer, assuming 4 channels per memory controller. Fine pitch through vias allow the DRAM to be structured to supply an entire cache line from a single row access.

When 512 GB DRAM is desired, it can be arranged into 64 separate optically connected memory modules ("OCM"). The OCMs exploit the same basic technology as the 8 GB DRAM described above. The optical die 108 performs two functions. First, the optical die 108 provides an interface to the optical fiber connections, such as external photonic interconnects 124 and 126. Second, the optical die 108 provides low power, global interconnect for the stack of DRAM. The OCMs and the processor are connected through optical fibers, which provides for as much as 48 channels that can be used for commands or other application-specific data exchanges.

Overall Operation of the Multi-Core, Stacked Computational Devices

For the sake of simplicity, photonic interconnection embodiments of the present invention are described below with reference to the computational device 100, wherein the processor die 102 comprises 64 quad-core clusters. It will be apparent to those skilled in the art that the photonic interconnect embodiments of the present invention are not limited to such devices and that these embodiments can be modified and implemented to provide photonic interconnections for multi-core computational devices having any number of clusters with any number of cores in various arrangements.

Figure 3:
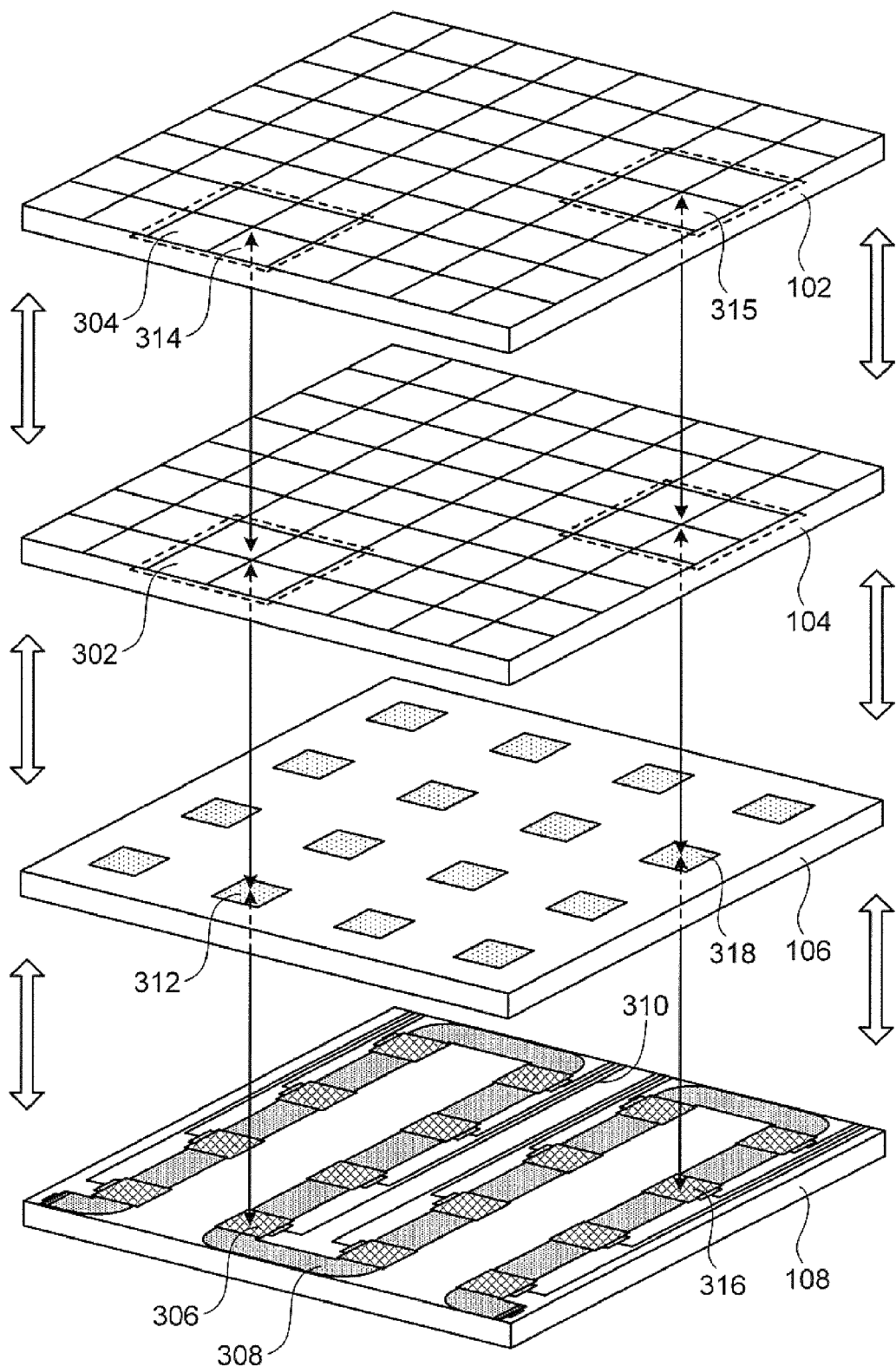
FIG. 3 shows an exploded isometric view of tour die layers of the computational device, shown in FIG. 1, in accordance with embodiments of the present invention.

FIG. 3 shows an exploded isometric view of the photonic die 102, the memory-controller die 104, the analog electronic die 106, and the optical die 108 in accordance with embodiments of the present invention. As shown in FIG. 3, the processor die 102 and the memory-controller die 104 are partitioned into 64 tiles. Each tile in the processor die 102 represents four cores called "clusters," and each tile in the memory-controller die 104 represents an L2 cache, a hub, a memory controller, and other devices that are in electronic communication with a corresponding cluster located approximately directly above in the processor die 102. For example, tile 302 of memory-controller die 104 represents an L2 cache, a hub, a memory controller and other devices located beneath and in electronic communication with an associated cluster 304. The clusters and tiles can be approximately 3 mm by 3 mm, but can be made larger or smaller depending on the implementation. Embodiments of the present invention are not limited to clusters having four cores. In other embodiments, a cluster can be comprised two, three, and four or more cores. An example of a cluster and tile are described below with reference to FIGS. 4A-4B. The optical die 108 includes 16 approximately regularly spaced optoelectronic converters, such as optoelectronic converter 306, 270 separate and approximately parallel (non-crossing) waveguides having a serpentine configuration, represented by strip 308, that wind their way through each of the 16 regularly spaced optoelectronic converters, and 16 bundles of 8 approximately parallel waveguides, each bundle emanating from a corresponding optoelectronic converter, such as bundle 310 emanating from the optoelectronic converter 306. The 270 serpentine waveguides are called "on-chip waveguides" that provide photonic communication between optoelectronic converters, and the waveguides comprising the 16 bundles of waveguides are called "off-chip waveguides" that provide photonic communication with devices located outside the computational device 100. The 16 optoelectronic converters are each comprised of four optoelectronic converter blocks (not shown). Each of the optoelectronic converter blocks ("converter blocks") is in electronic communication with one of the four associated tiles in the memory-controller die 104. The converter blocks are described in greater detail below with reference to FIGS. 6 and 7. The analog electronic die 106 includes 16 patches, each patch is located between four tiles in the memory-controller die 104 and an optoelectronic converter in the optical die 108. Each patch comprises a number of metalized or silicon filled through vias that provide for analog electronic communication between the four tiles in the memory-controller die 104 and the corresponding optoelectronic converters. Data is transmitted through the patches in the form of electronic analog signals ("electrical signals") because producing analog signals typically consumes considerably less power than producing digital electrical signals.

The following description is an overview of how the optical die 108 can be used to transmit data between clusters on the processor die 102 and transmit data between clusters and external devices. Data generated by a cluster of the processor die 102, such as cluster 304, or extracted from a tile of the memory-controller die 104, such as tile 302, is transmitted as data encoded electrical signals through vias in a patch 312 to a corresponding converter block (not shown) of the optoelectronic converter 306. The converter block encodes the electrical signals into one or more wavelengths of electromagnetic radiation, called "channels," propagating in one or more of the on-chip waveguides 308. Encoding data into unmodulated channels can be accomplished by modulating the intensity of the channels, which is described in greater detail below with reference to FIG. 14. Channels carrying data are referred to as "encoded channels." The encoded channels can be destined for (1) a neighboring cluster 314, which is also in electronic communication with the same optoelectronic converter 306, (2) a cluster located elsewhere in the processor die 102 such as cluster 315, or (3) an external device (not shown). When the encoded channels are destined for the neighboring cluster 314, its corresponding converter block located within the optoelectronic converter 306 receives the encoded channels and converts them back into encoded electrical signals that are transmitted back through the patch 312 to the cluster 314. When the data encoded channels are destined for the cluster 315, the encoded channels are transmitted along appropriate on-chip waveguides to a converter block corresponding to the cluster 315 located with an optoelectronic converter 316. The encoded channels are converted back into encoded electrical signals that are transmitted through a patch 318 to the cluster 315. When the encoded channels are destined for an external device, the converter block of the optoelectronic converter 306 places the encoded channels onto off-chip waveguides of the bundle 310 where the encoded channels exit the optical die 108. When an external device generates encoded channels destined for one of the four clusters 314, the encoded channels can be transmitted along the off-chip waveguides in the bundle 310 to the optoelectronic converter 306 where the encoded channels are converted into encoded electrical signals that are transmitted through the patch 312 to the four clusters 314 for processing. A more detailed description of the operation and components of the optical die 108 is provided below with reference to FIG. 7.

Clusters and Memory Controllers

Figure 4A:
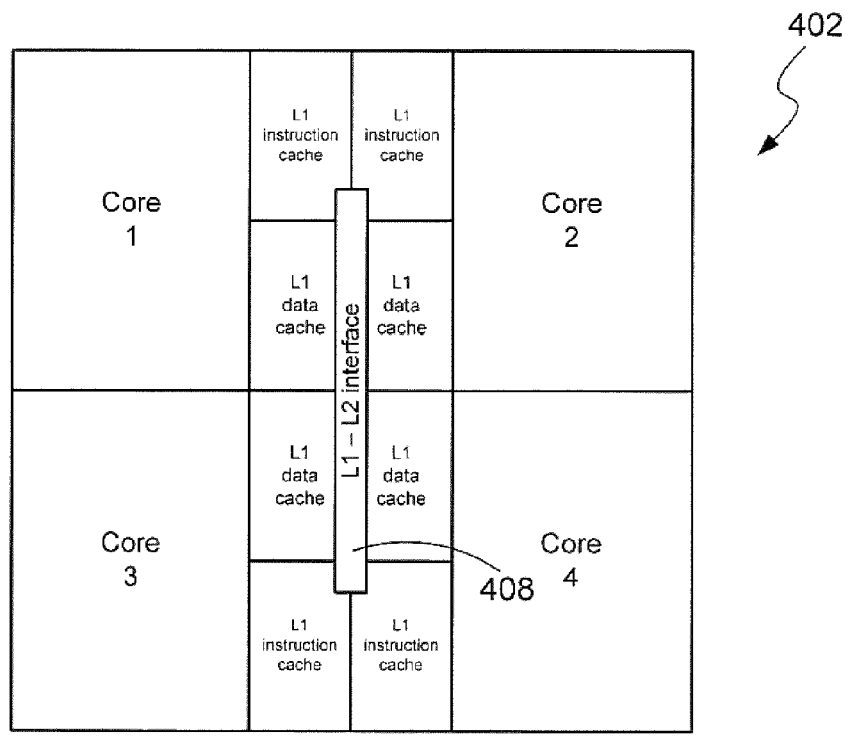
FIG. 4A shows a cluster of a processor die in accordance with embodiments of the present invention.
Figure 4B:
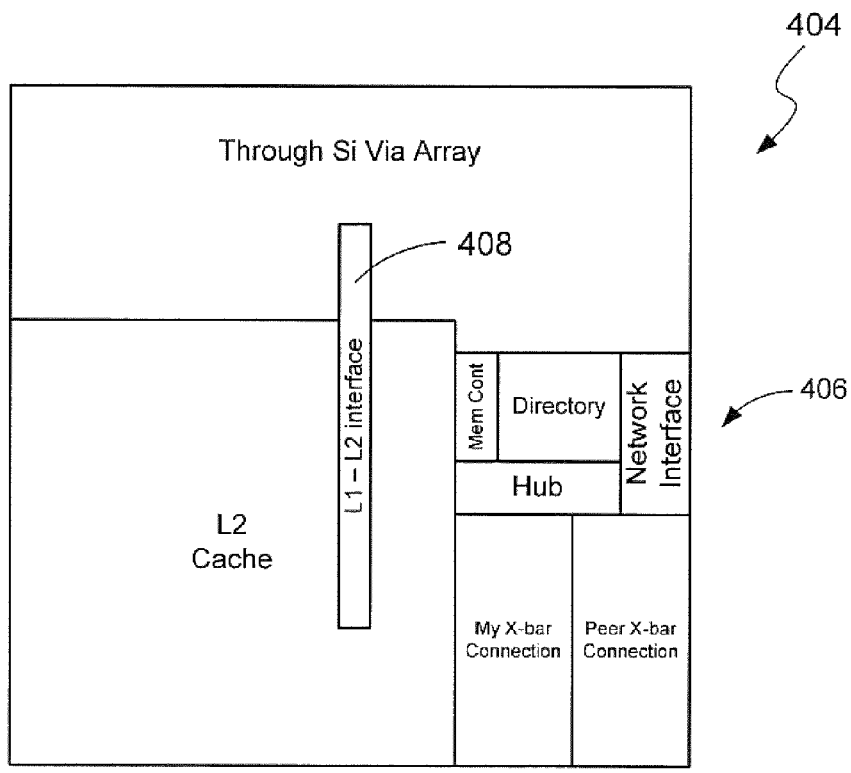
FIG. 4B shows of a tile of a memory die in accordance with embodiments of the present invention.

FIG. 4A shows a cluster 402 of the processor die 102 in accordance with embodiments of the present invention. The cluster 402 comprises four cores. Each core is in electrical communication with an L1 instruction cache and an L1 data cache. An L1 instruction cache and an L1 data cache are high speed random access memory that temporarily store frequently or recently accessed instructions and data. FIG. 4B shows a tile 404 of the memory-controller die 104 in accordance with embodiments of the present invention. The tile 404 includes an L2 cache and a component region 406 comprising a hub, a memory controller, directory, network interface, a my crossbar connection, and a peer crossbar connection. These crossbar connections may be configured to interface with corresponding portions of the optoelectronic converters. The L2 cache is shared by the four cores of the cluster 402. An L1-L2 interface 408 is positioned in approximately the center of the cluster 402 and the tile 404 and provides electronic communication between the cluster 402 and the tile 404.

Small, power efficient cores and caches achieve near optimal possible performance per unit of energy. Therefore, the cores selected for the present invention can use a 5 GHz clock, and the cores can be dual-issue, in-order, and multithreaded and may be configured to offer single instruction multiple data ("SIMD") instructions allowing 4 multiply-accumulate and 4-word-wide load/store operations. SIMD can be a collection of low-level functions designed to accelerate floating-point performance. The SIMD process enables one instruction to perform the same function on multiple pieces of data reducing the number of loops required to handle data. With just 64 quad clusters, as described above with reference to FIG. 3, that operate in accordance with a 5 GHz clock, the compute bandwidth of the computational device 100 may be 10 Tflops/s. Each cluster may send at least one cache line, such as 64 to 128 bytes, during 24-clock-cycles called "epochs."

Figure 5:
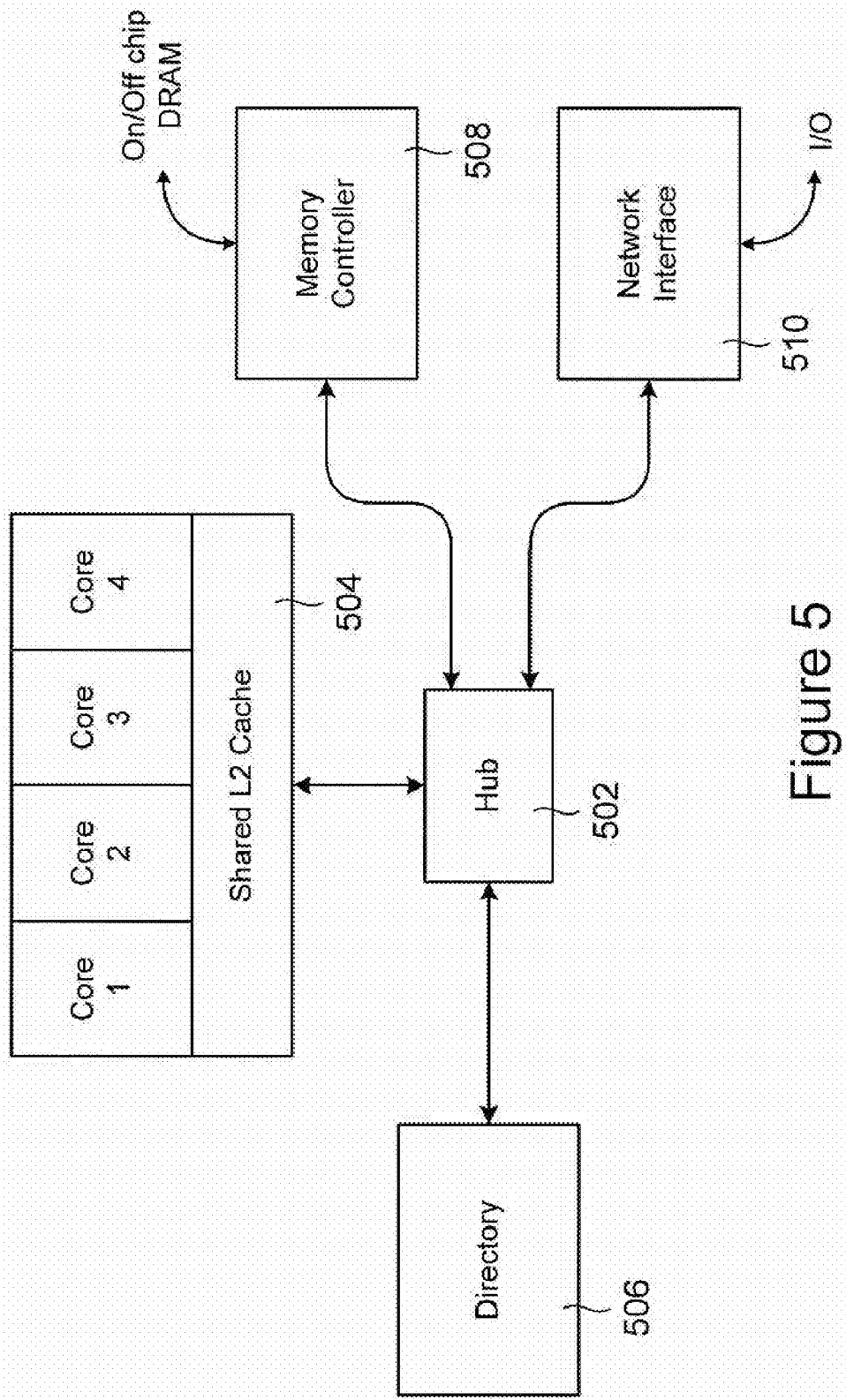
FIG. 5 shows a schematic representation of interactions between components of the cluster and tile shown in FIGS. 4A-4B in accordance with embodiments of the present invention.

FIG. 5 shows a schematic representation of interactions between components of the cluster and tile shown in FIGS. 4A-4B in accordance with embodiments of the present invention. The hub 502 distributes encoded electrical signals to the L2 cache 504, the directory 506, the memory controller 508, and the network interface 510. The hub 502 is also responsible for transmitting encoded electrical signals to and from the optoelectronic converter of the optical die 108, as described above with reference to FIG. 3. The network interface 510 provides connections to an external network, and the memory controller 508 manages the flow of data going to and from the L2 cache 504, the memory 110-113 shown in FIG. 1, and external memory, such as the DIMMs 216-218 shown in FIG. 2.

Figure 6:
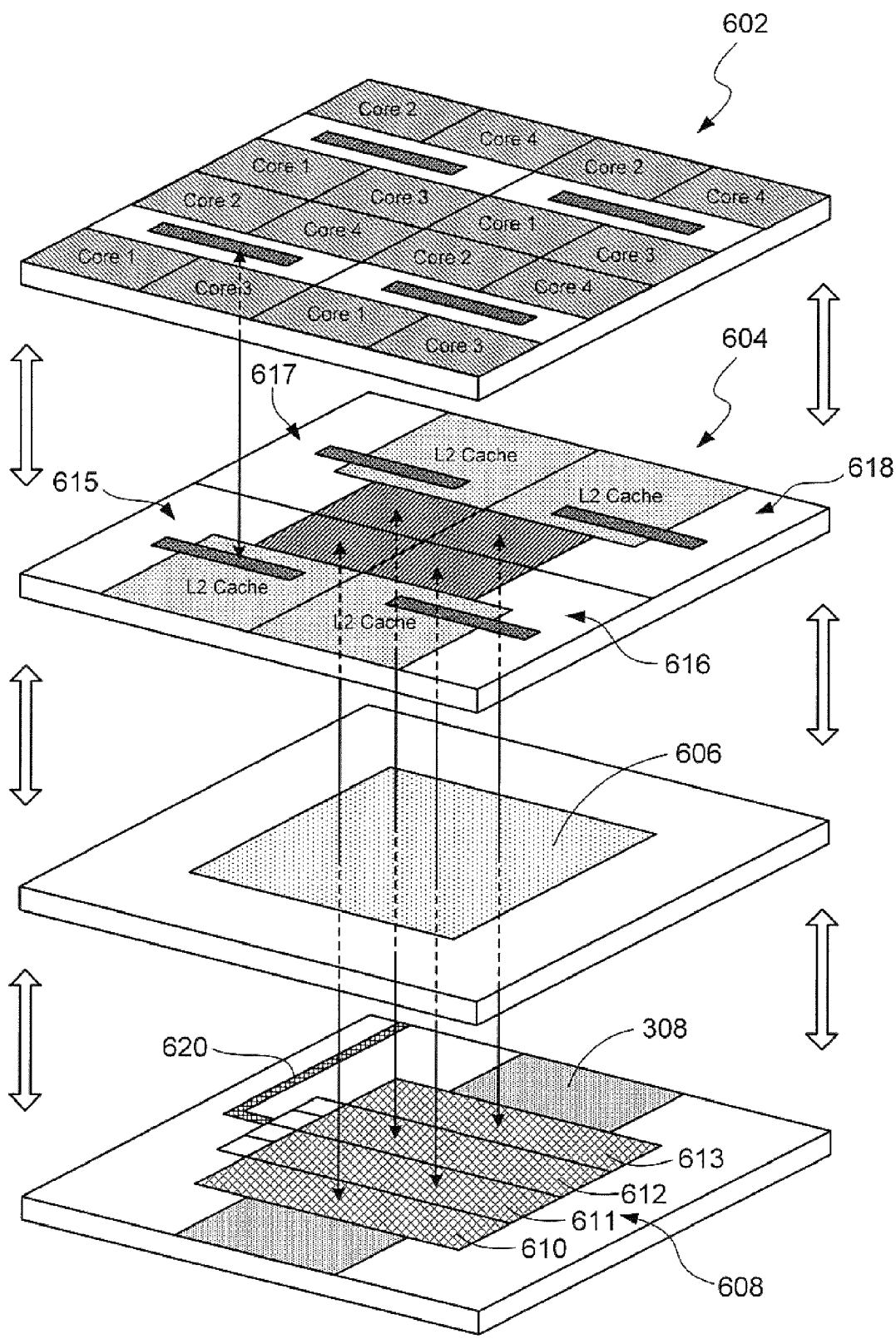
FIG. 6 shows an enlarged, exploded isometric view of the four die layers of the computation device, shown in FIG. 1, in accordance with embodiments of the present invention.

FIG. 6 shows an enlarged, exploded isometric view of four clusters 602 of the processor die 102, four corresponding tiles 604 of the memory-controller die 104, a patch 606 of the analog electronic die 106, and an optoelectronic converter 608 of the optical die 108 arranged in accordance with embodiments of the present invention. As shown in FIG. 6, the optoelectronic converter 608 comprises four individual optoelectronic converter blocks 610-613. Each converter block is in electronic communication with one of the four tiles 604 via the patch 606. In particular, tile 615 is in electronic communication with the converter block 610, tile 616 is in electronic communication with the converter block 611, tile 617 is in electronic communication with the converter block 612, and tile 618 is in electronic communication with the converter block 613. The converter blocks 610-613 convert encoded electrical signals output from the tiles 615-618, respectively, into encoded channels that can be transmitted on a portion of the on-chip waveguides 308 for processing by other clusters or transmitted on a bundle of waveguides 620 to external devices for processing. The converter blocks 610-613 also convert encoded channels transmitted in the bundle 620 and the on-chip waveguides 308 into encoded electrical signals that can be processed separately by the four clusters 602.

Optical Die

Figure 7A:
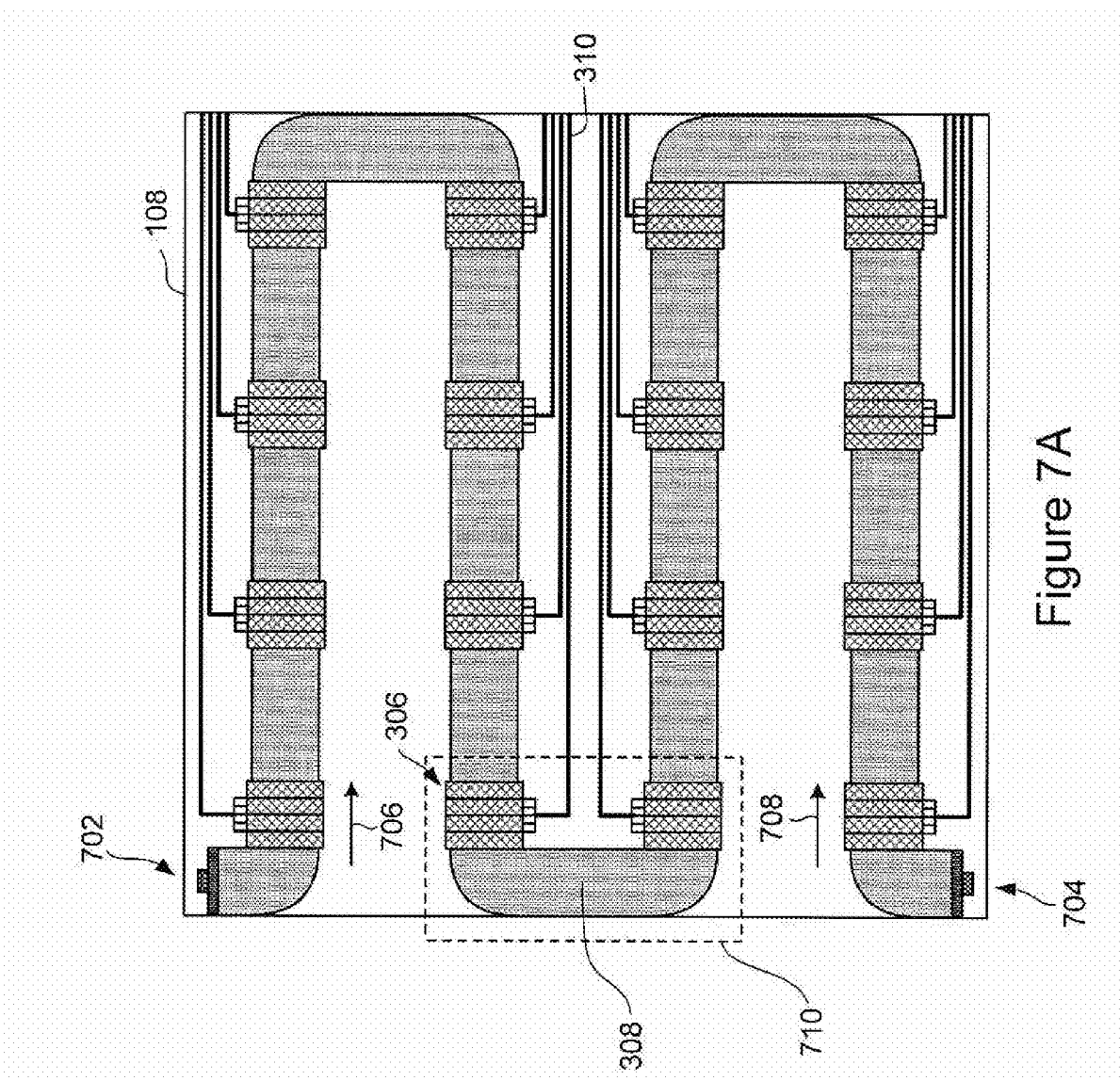
FIG. 7A shows a schematic representation of an optical die in accordance with embodiments of the present invention.

FIG. 7A shows a schematic representation of the optical die 108 in accordance with embodiments of the present invention. As shown in FIG. 7A, and as described above with reference to FIG. 3, the optical die 108 includes 270 separate, approximately parallel, non-intersecting, on-chip waveguides 308, 16 approximately regularly spaced optoelectronic converters, and 16 bundles of 8 off-chip waveguides. The on-chip waveguides 308 can be disposed in a serpentine configuration so that all 270 on-chip waveguides 308 can be photonically coupled to each of the 16 optoelectronic converters. FIG. 7A reveals that each optoelectronic converter comprises four converter blocks. In other words, the optical die 108 includes 64 converter blocks that are each in communication with one of the 64 tiles of the memory-controller die 104. FIG. 7A also reveals two, substantially identical, channel sources 702 and 704 positioned at opposite ends of the serpentine on-chip waveguides 308. The sources 702 and 704 are each configured to output the same set of 64 different channels onto each of the on-chip waveguides in opposite directions. Directional arrow 706 represents the direction channels output from the source 702 are transmitted, and directional arrow 708 represents the direction channels output from the source 704 are transmitted. The serpentine on-chip waveguides 308 have a width of approximately 1900 μm.

Embodiments of the present invention are not limited to on-chip waveguides having the serpentine shape shown in FIG. 7A. The configuration of the on-chip waveguides may assume any suitable shape that may depend on the number of optoelectronic converters, the layout of the optoelectronic converters, and the amount of space available on the optical die.

Figure 7B:
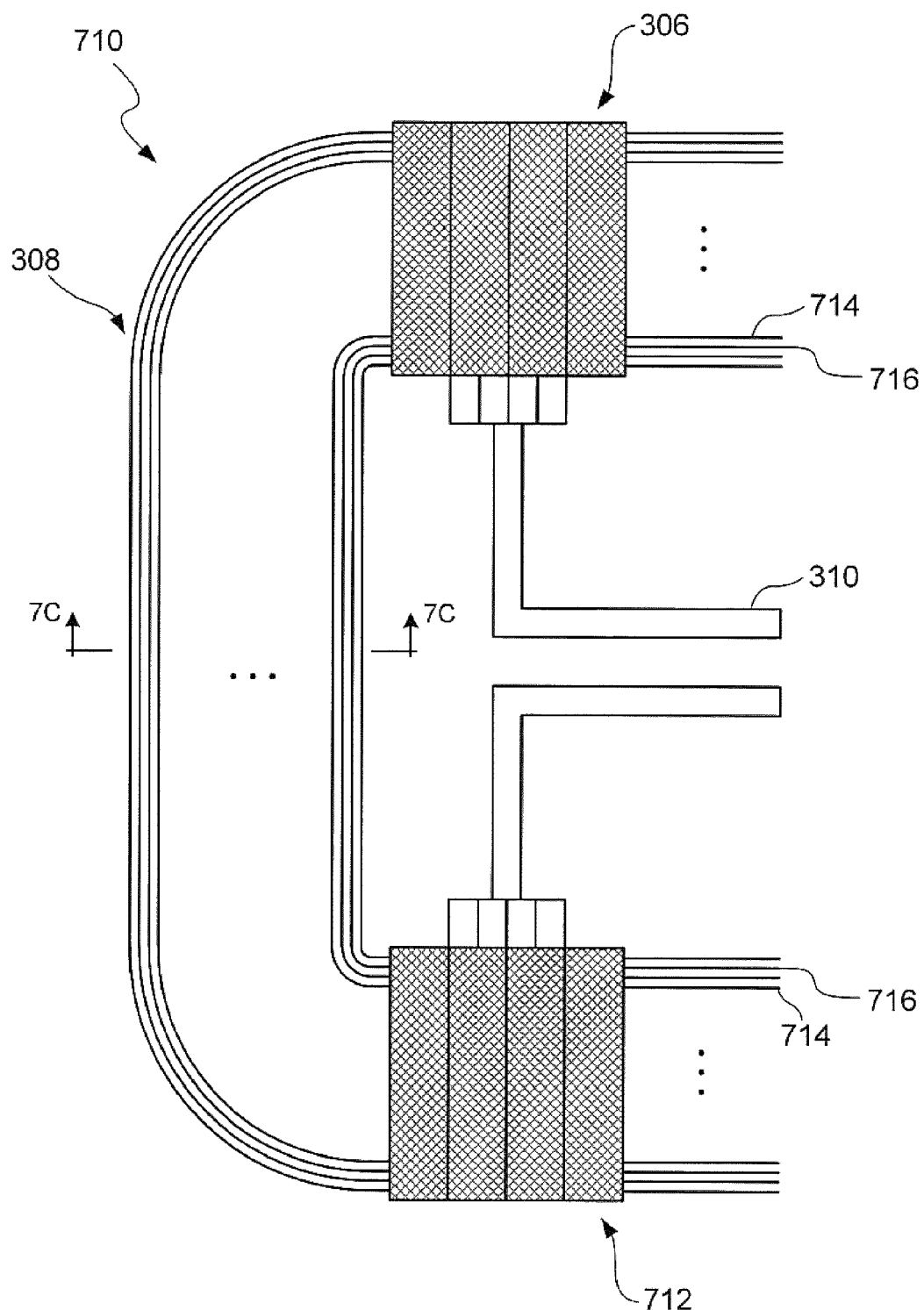
FIG. 7B shows an enlargement of a region of the optical die, shown in FIG. 7A, in accordance with embodiments of the present invention.

FIG. 7B shows an enlargement of a region 710, shown in FIG. 7A, of the optical die 108 in accordance with embodiments of the present invention. As shown in FIG. 7B, for the sake of simplicity of illustration, only 8 of the 270 serpentine on-chip waveguides 308 are displayed. FIG. 7B reveals that the waveguides do not intersect and are approximately parallel, such as waveguides 714 and 716.

Figure 7C:
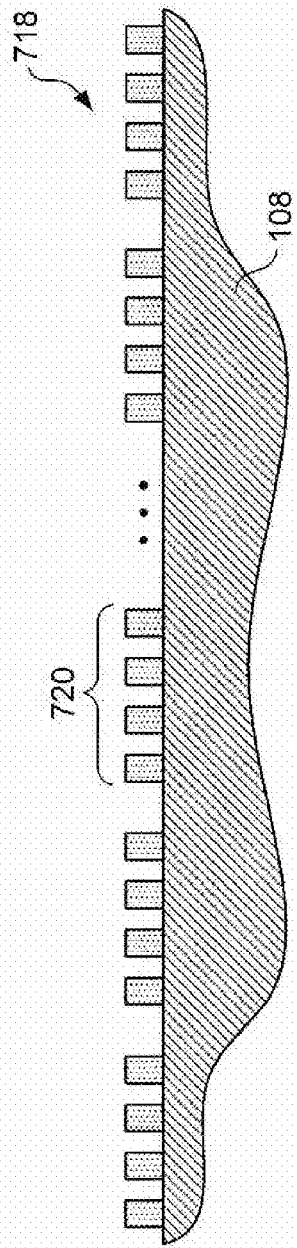
FIG. 7C shows a cross-sectional view of a portion of on-chip ridge waveguides along a line 7C-7C, shown in FIG. 7B, in accordance with embodiments of the present invention.

The on-chip waveguides 308 can be ridge waveguides or photonic crystal waveguides with cross-sectional dimensions ranging from about 0.25 to about 0.5 microns FIG. 7C shows a cross-sectional view of a portion 718 of the on-chip ridge waveguides 308 along a line 7C-7C, shown in FIG. 7B, in accordance with embodiments of the present invention. For the sake of simplicity of illustration, the portion 718 of on-chip ridge waveguides represents 20 of the 270 on-chip ridge waveguides disposed on the surface of the optical die 108. As shown in FIG. 7C, the ridge waveguides are disposed in bundles, each bundle having 4 waveguides, such as bundle 720.

Figure 7D:
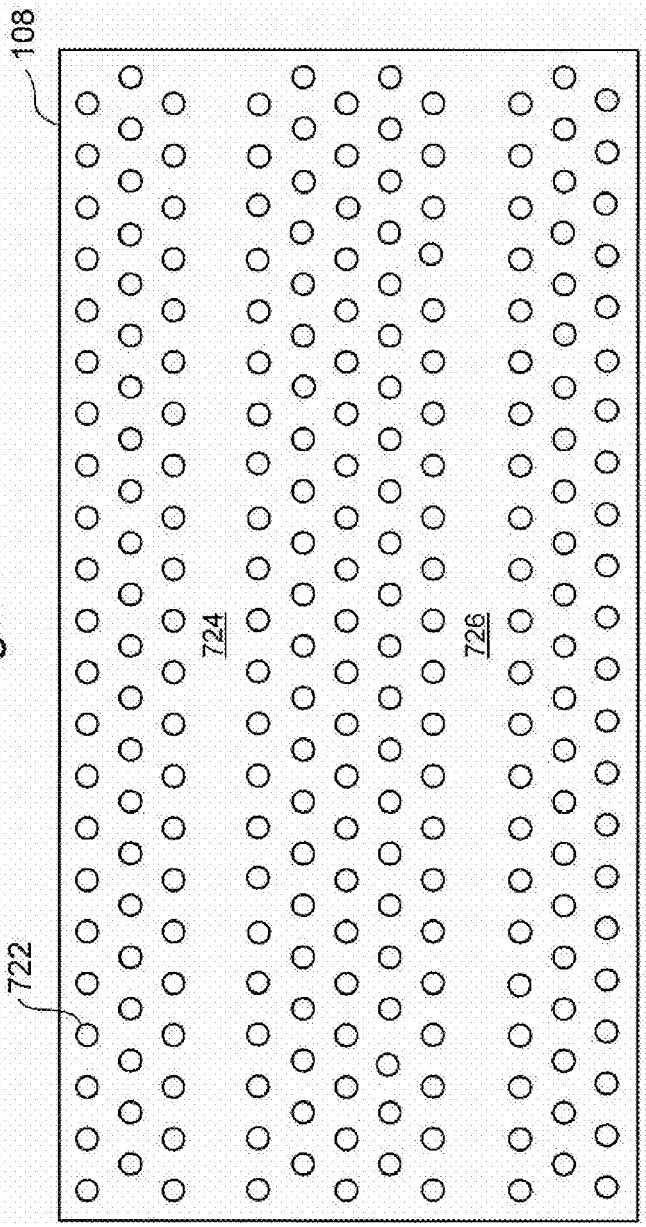
FIG. 7D shows a top view of a portion of two approximately parallel photonic crystal waveguides in accordance with embodiments of the present invention.

FIG. 7D shows a top view of a portion of two approximately parallel photonic crystal waveguides in accordance with embodiments of the present invention. In FIG. 7D, circles, such as circle 722, represent a regular lattice of openings in a dielectric or semiconductor substrate layer of the optical die 108. Regions without openings are photonic crystal waveguides 724 and 726. The openings can be filled with air or a suitable dielectric material having a refractive index that is lower than that of the substrate layer. The regular lattice of openings creates a two-dimensional Bragg grating surrounding the waveguides 724 and 726. This two-dimensional Bragg grating confines ER of an appropriate wavelength to the waveguides 724 and 726. Photonic crystal waveguides are well-known, and the textbooks *Fundamentals of Optical Waveguides*, by Katsunari Okamoto, Elsevier Inc. 2005; *Optical Waveguide Theory*, by Snyder and Love, Chapman and Hall, London, 1983; and *Photonic Crystals*, by Jean_Michel Lourtioz, Springer-Verlag, Berlin, 2005 are just three of many references in this field.

Figure 8:
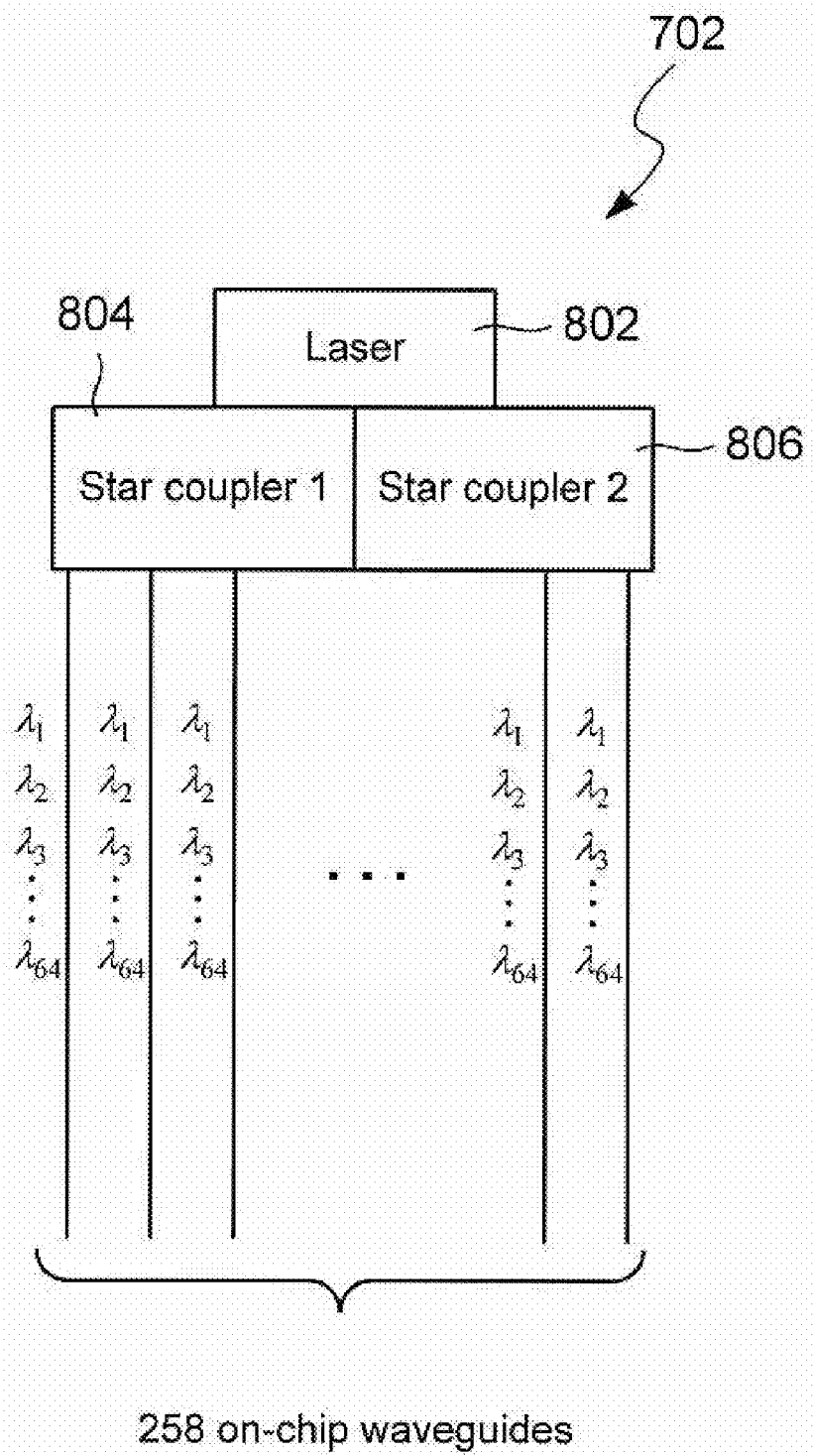
FIG. 8 shows a schematic representation of an electromagnetic radiation source in accordance with embodiments of the present invention.

FIG. 8 shows a schematic representation of the source 702 in accordance with embodiments of the present invention. The source 702 comprises a laser 802 and two star couplers 804 and 806. The laser 802 can be a racetrack, mode-lucked laser that emits 64 different wavelengths of unmodulated electromagnetic radiation. Each wavelength or "channel" is represented by $\lambda_1, \lambda_2, \lambda_3, \ldots, \lambda_{64}$, and each channel has a relatively constant intensity. The star couplers 804 and 806 each comprise beam splitters configured in a tree structure that places the 64 channels onto each of 258 of the 270 on-chip waveguides 308, as shown in FIG. 8. In certain embodiments of the present invention, the laser 802 can be a hybrid III-V semiconductor/Si mode-locked laser that generates M+1 laser wavelengths. (See e.g., A. W. Fang et al., "Integrated AlGaInAs-silicon evanescent race track laser and photodetectors," Optics Express 15, 2315 (2007).)

The optical die 108 operates synchronously in epochs of 24 clock cycles. The available unencoded channels are grouped into logical channels that can send either a cache line, or a broadcast message, or a control message, in a single epoch. One logical channel can communicate one cache line or control message in one epoch. The grouping of channels into logical channels is done in a way that permits a cluster to receive and send up to one cache line every 4 (24 clock cycles/6 channels) clock cycles, yielding a total bandwidth of 10 Tbytes/s [64 clusters×(128 Bytes/4 clocks)×5 GHz].

Optoelectronic Converters

Figure 9B:
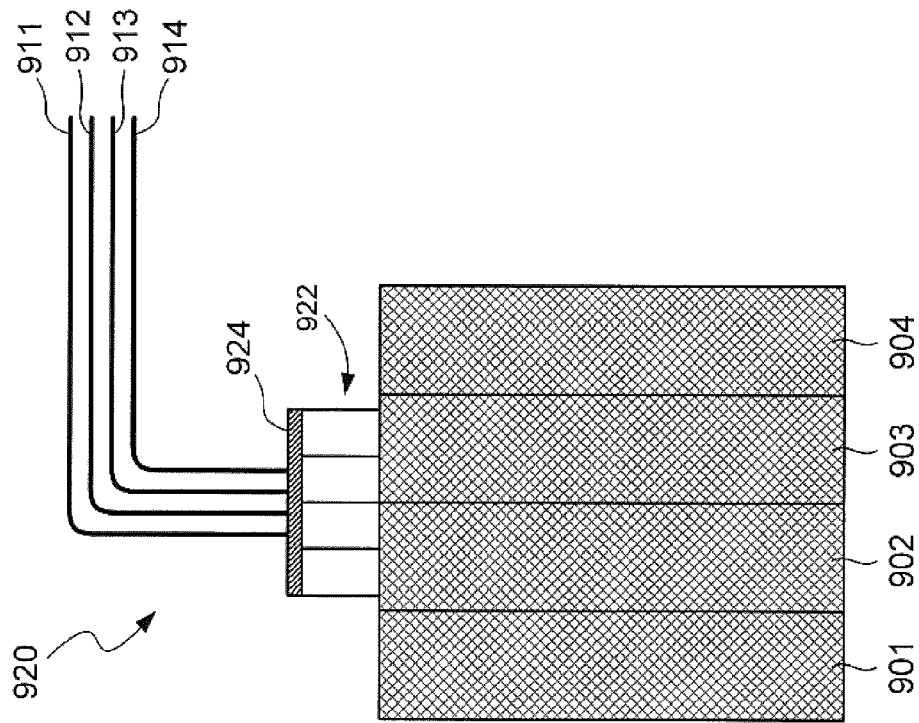
FIGS. 9A-9B show schematic representations of two optoelectronic converters in accordance with embodiments of the present invention.
Figure 9A:
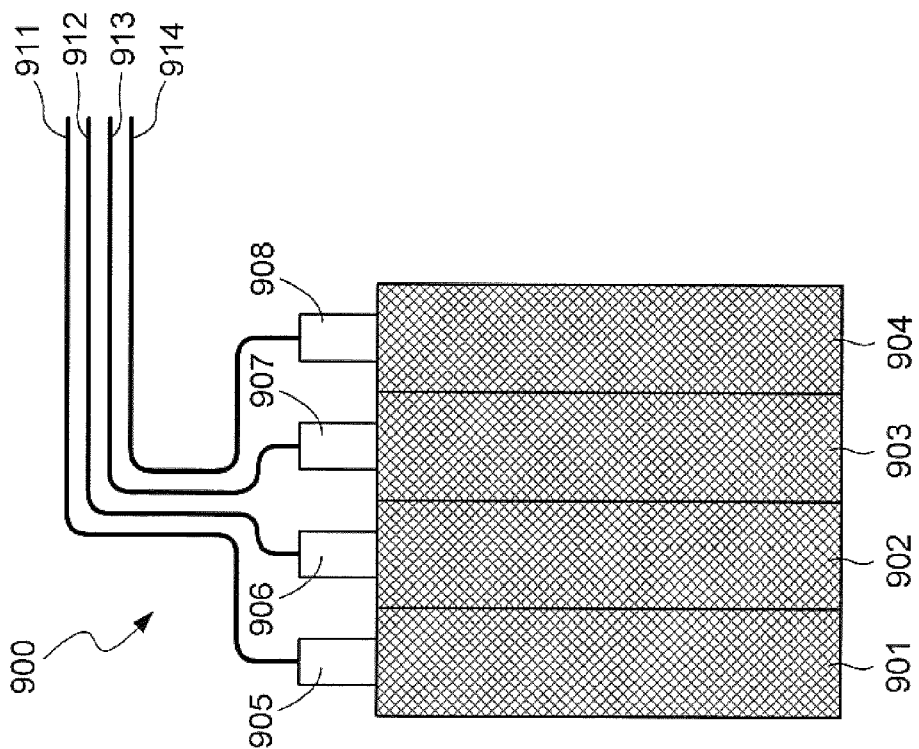

FIGS. 9A-9B show schematic representations of two types of optoelectronic converters in accordance with embodiments of the present invention. In FIG. 9A, a first optoelectronic converter 900 comprises four converter blocks 901-904 that are photonically coupled to four off-chip communications hubs 905-908. The communications hubs 905-908 are each photonically coupled to bundles 911-914, where each bundle comprises 8 off-chip waveguides. In FIG. 9B, a second optoelectronic converter 920 comprises the same four converter blocks 901-904 that are photonically coupled to off-chip communication hubs grouped into a single device 922. Bundles 911-914 are photonically coupled to the device 922 via a serialization/deserialization device 924.

Figure 10:
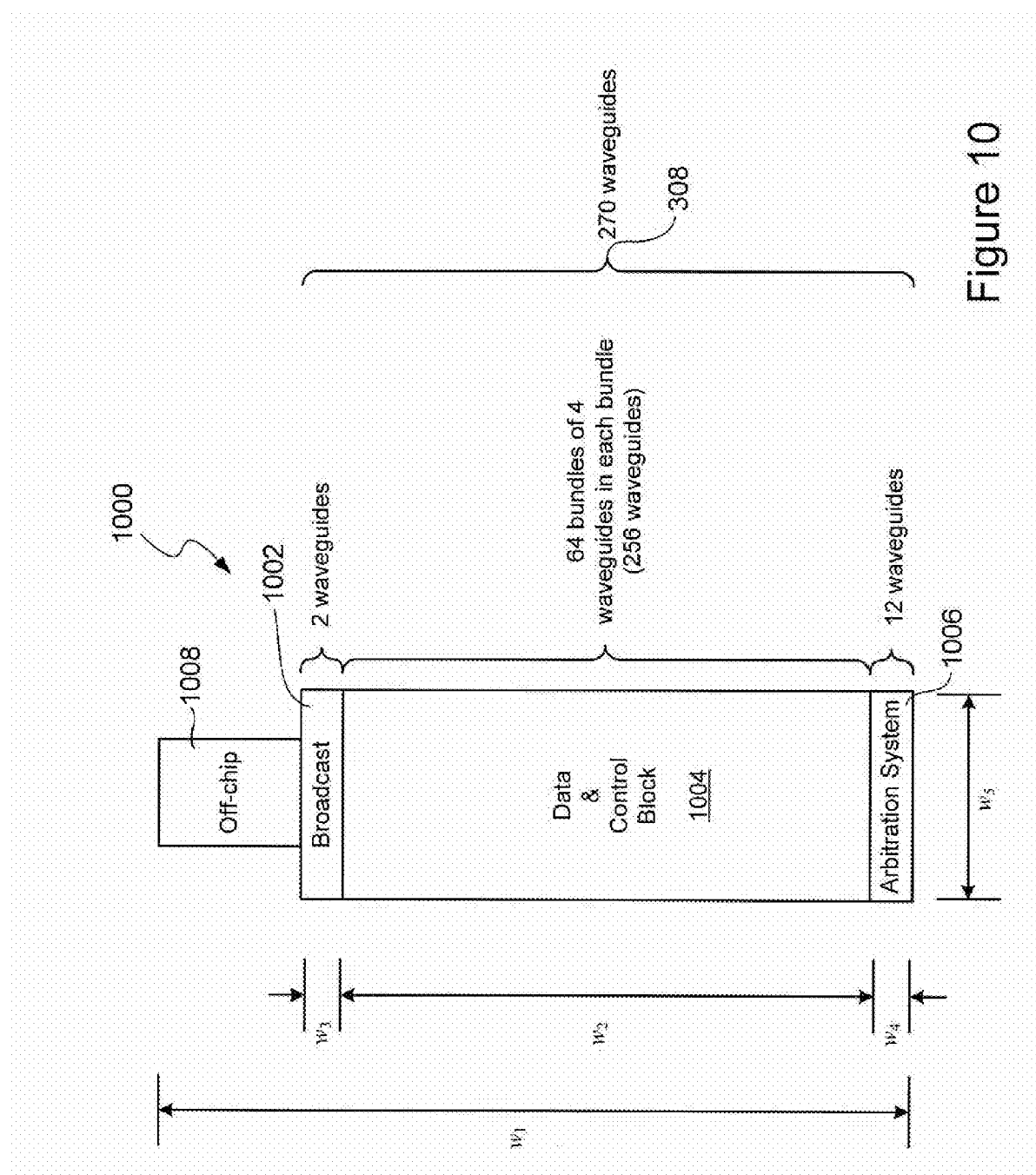
FIG. 10 shows a schematic representation of components of a converter block for an optoelectronic converter in accordance with embodiments of the present invention.

FIG. 10 shows a schematic representation of components of a converter block 1000 in accordance with embodiments of the present invention. The converter block 1000 comprises a broadcast system 1002, a data/control block 1004, an arbitration system 1006, and an off-chip communications hub 1008. The operation and architecture of the arbitration system 1600 are described in greater detail below with reference to FIGS. 18 and 19. The broadcast system 1002 allows the associated cluster to send data to all the other clusters at about the same time. The data/control block 1004 is dedicated to a particular tile of the memory-controller die 104 and converts encoded channels into encoded electrical signals that are transmitted to the particular tile and converts encoded electrical signals output from the tile into encoded channels that are transmitted to another cluster in the computational device. Architectural embodiments of the data/control block 1004 are described in greater below with reference to FIGS. 11-13. The arbitration system 1006 grants a cluster the right to use a cluster or bundle of waveguides in a given epoch. As shown in FIG. 10, two of the 270 on-chip waveguides 308 are dedicated to the broadcast system 1002, twelve of the on-chip waveguides 308 are dedicated to the arbitration system 1006, and 256 of the on-chip waveguides 308 are dedicated to the data/control block 1004. The 256 on-chip waveguides are arranged into 64 bundles. Each of the 64 bundle comprises 4 on-chip waveguides that are dedicated a particular tile in the memory die 102.

FIG. 10 also includes parameters $w_1$, $w_2$, $w_3$, $w_4$, and $w_5$ representing dimensions of components of the converter block 1000. In certain embodiments, $w_1$ can range from approximately 2100-2400 μm, $w_2$ can range from approximately 1700-2100 μm, $w_3$ can range from approximately 32-44 μm, $w_4$ can range from approximately 80-120 μm, and $w_5$ can range from approximately 500-600 μm. Preferably, $w_1$ can be approximately 2290 μm, $w_2$ can be approximately 1900 μm, $w_3$ can be approximately 38 μm, $w_4$ can be approximately 100 μm, and $w_5$ can be approximately 530 μm, but these dimensions and ranges can be varied depending on the implementation.

Figure 11:
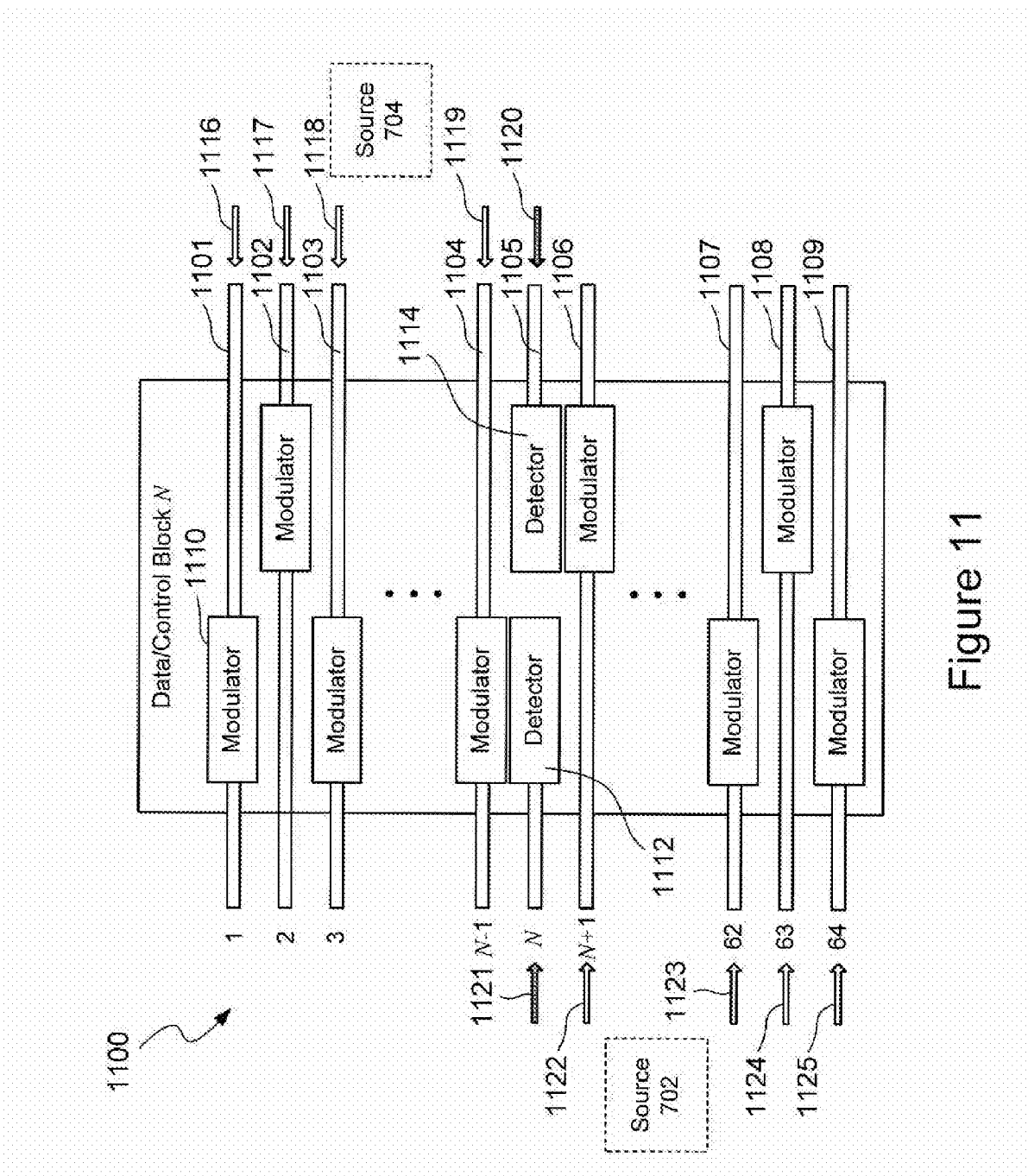
FIG. 11 shows a schematic representation of a data/control block of an optoelectronic converter in accordance with embodiments of the present invention.

FIG. 11 shows a schematic representation of a data/control block 1100 in accordance with embodiments of the present invention. The data/control block 1100 represents the Nth of the 64 data/control blocks in the optical die 102. Horizontal lines 1101-1109 represent only 9 of the 64 bundles of 4 on-chip waveguides associated with each of the 64 data/control blocks (the remaining 55 bundles are not shown). The bundles are also labeled 1 through 64 from top to bottom, each label corresponding to a particular data/control block. Each data/control block uses a particular bundle for receiving encoded channels output from the other 63 data/control blocks. The remaining 63 bundles are used by the data/control block to send encoded channels to the other 63 data/control blocks. For example, as shown in FIG. 11, the data/control block 1100 has 63 bundled waveguide modulators, such as bundled waveguide modulator 1110, that are photonically coupled to the bundles one through N−1 and the bundles N+1 though 64. The data/control block 1100 also has two bundled waveguide detectors 1112 and 1114 that are photonically coupled to the Nth bundle 1105. The data/control block 1100 receives 64 unencoded (i.e., unmodulated) channels in each of on-chip waveguides of the $1^{st}$ through N−1 bundles and the N+1 though the $64^{th}$ bundles from the sources 702 and 704.

As shown in FIG. 11, the data/control block 1100 is configured to use the unencoded channels provided by the source 702 to generate encoded channels that are destined for the data/control blocks N+1 though the $64^{th}$ and use the unencoded channels provided by the source 704 to generate encoded channels that are destined for the data/control blocks one through N−1. For example, as shown in FIG. 11, the data/control block 1100 receives unencoded channels on the bundles 1101-1104 originating from the source 704, as indicated by directional arrows 1116-1120, and uses the bundled waveguide modulators that are photonically coupled to the bundles 1101-1104 to encode data in these unencoded channels 1116-1120 that is destined for the data/control blocks one through N−1. On the other hand, the data/control block 1100 also receives unencoded channels on the bundles 1106-1109 originating from the source 702, as indicated by directional arrows 1121-1125, and uses the bundled waveguide modulators that are photonically coupled to the bundles 1106-1109 to encode data in the unencoded channels 1112-1125 that is destined for the data/control blocks N+1 through 64. The data/control block 1100 uses the bundled waveguide detectors 1112 and 1114 to receive encoded channels 1120 and 1121 sent by the other 63 data/control blocks.

Figure 12:
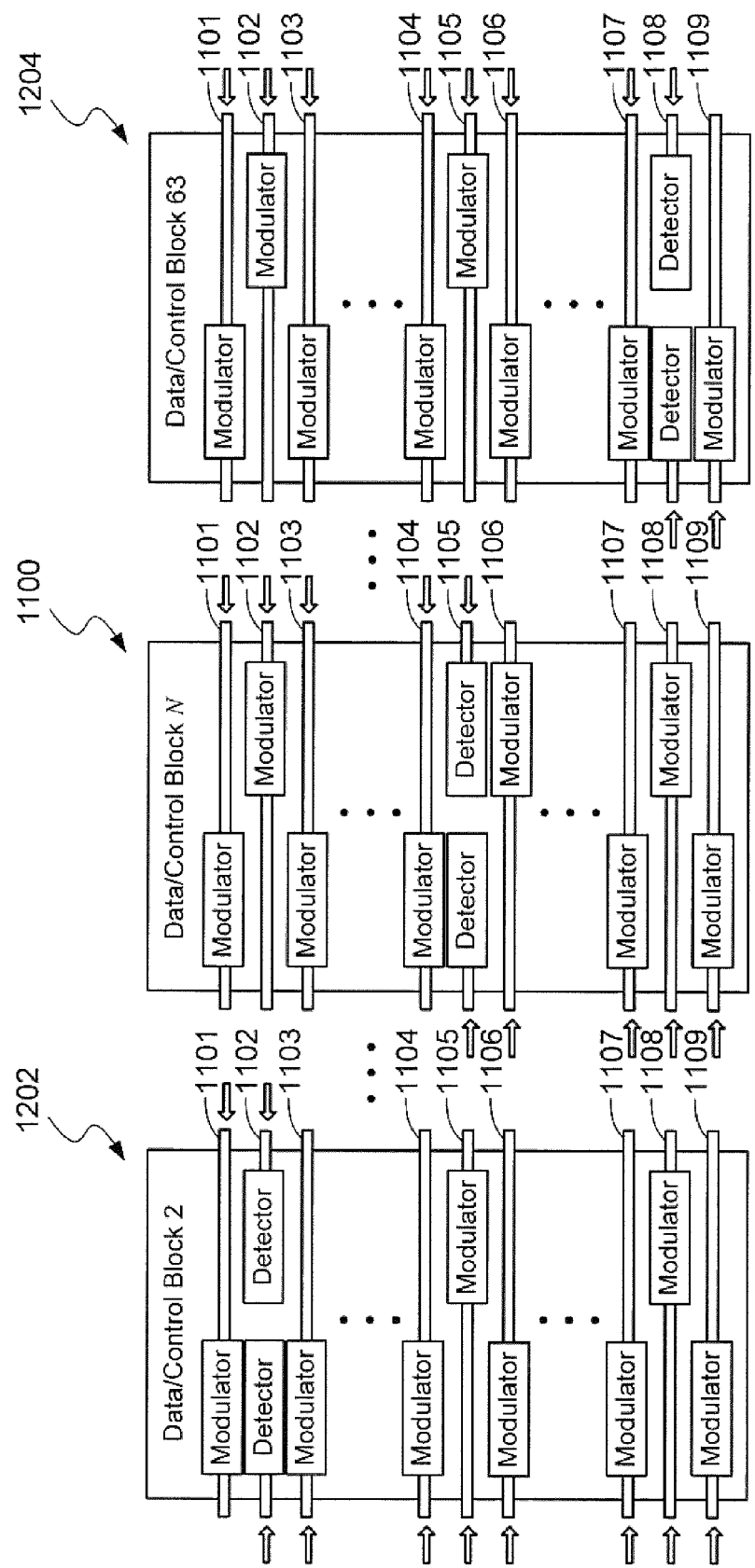
FIG. 12 shows a schematic representation of three data/control blocks in accordance with embodiments of the present invention.

FIG. 12 shows a schematic representation of three data/control blocks in accordance with embodiments of the present invention. As shown in FIG. 12, the second data/control block 1202 is configured to receive encoded channels on the second bundle 1102, and the $63^{rd}$ data/control block 1204 is configured to receive encoded channels on the $63^{rd}$ bundle 1108. The data/control blocks 1100 and 1204, and other data and control blocks not shown, use the bundle 1102 to send encoded channels to the second data/control block 1202. These encoded channels pass undisturbed through the data/control blocks located in between. The data/control blocks 1100 and 1202, and other data and control blocks not shown, use the bundle 1108 to send encoded channels to the $63^{rd}$ data/control block 1204. These encoded channels pass undisturbed through the data/control blocks located in between. The architecture and operation of the bundled waveguide modulators and detectors are described in greater detail below with reference to FIGS. 13 and 14.

Note that in other embodiments of the present invention, the data/control block 1100 can also be configured to use the unencoded channels provided by the source 702 to generate encoded channels that are destined for the data/control blocks 1 through N−1, and use the unencoded channels provided by the source 704 to generate encoded channels that are destined for the data/control blocks N+1 through 64.

Figure 13:
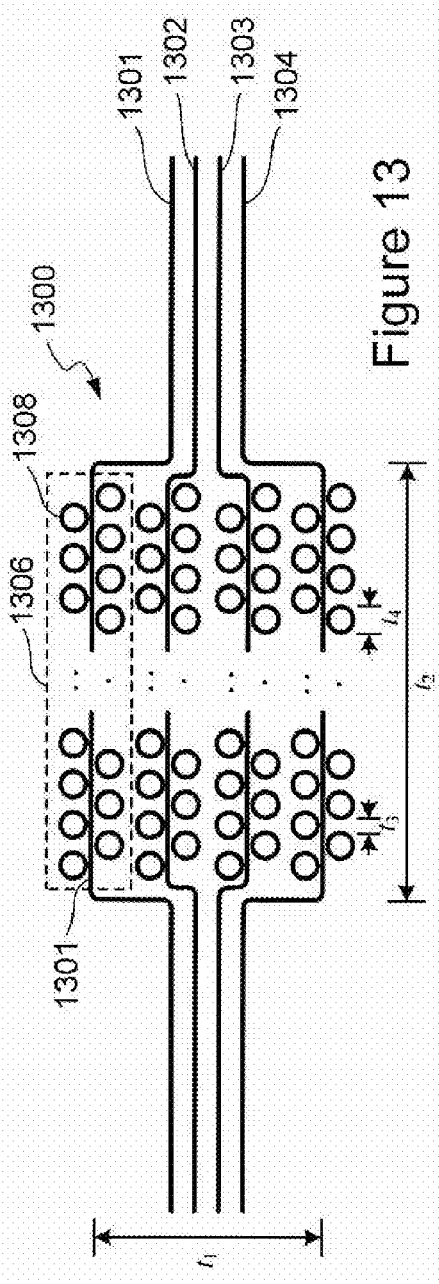
FIG. 13 shows a schematic representation of an enlarged bundled waveguide modulator/detector in accordance with embodiments of the present invention.

The bundled waveguide modulator and the bundled waveguide detector are nearly identically configured devices. FIG. 13 shows a schematic representation of an enlarged bundled modulator/detector 1300 in accordance with embodiments of the present invention. As described above with reference to FIGS. 11-12, the bundled waveguide modulator/detector 1300 receives channels on a bundle of four on-chip waveguides 1301-1304. The bundled waveguide modulator/detector 1300 comprises four waveguide-microring systems, such as waveguide-microring system 1306. The four waveguide-microring systems include the approximately parallel waveguides 1301-1304, but the separation distance between the waveguides 1301-1304 can range from approximately 10-14 μm, which is larger than the separation distance between the bundled waveguides 1301-1304 outside the bundled waveguide modulator/detector 1300. Each waveguide-microring system includes 64 microrings, such as microring 1308. The 64 microrings are adjacent to and distributed on opposite sides along the length of each waveguide. Each of the microrings is configured to be resonant with one of the 64 channels transmitted along a photonically coupled waveguide. The configuration of the microrings is described below with reference to FIG. 17.

FIG. 13 also includes parameters $t_1$, $t_2$, $t_3$, and $t_4$ representing dimensions of components of the waveguide-microring system 1300. In certain embodiments, $t_1$ can range from approximately 45-65 μm, $t_2$ can range from approximately 200-300 μm, $t_3$ can range from approximately 0.5-5 μm, and $t_4$ can range from approximately 1-10 μm. Preferably, $t_1$ can be approximately 57.5 μm, $t_2$ can be approximately 255 μm, $t_3$ can be approximately 2 μm, and $t_4$ can be approximately 5 μm, but the invention is not limited to these dimensions or dimension ranges. These dimensions and dimension ranges can be varied depending on the implementation.

Figure 14:
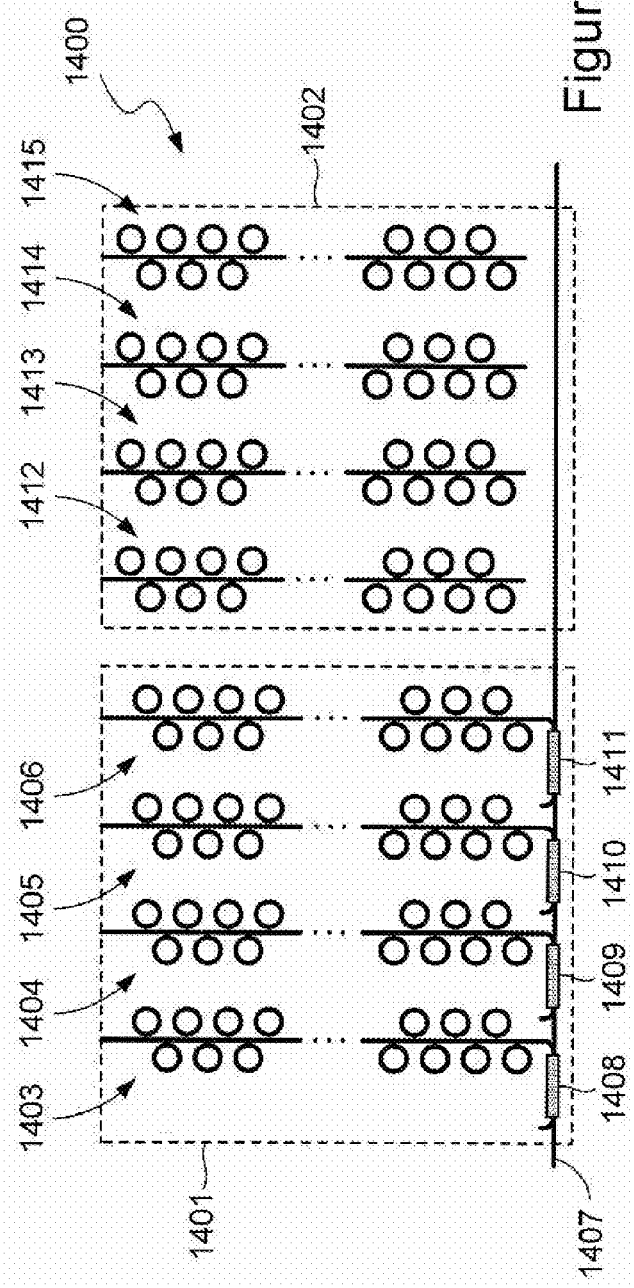
FIG. 14 shows an off-chip communications hub in accordance with embodiments of the present invention.

FIG. 14 shows an off-chip communications hub 1400 in accordance with embodiments of the present invention. The off-chip communications hub 1400 comprises an off-chip waveguide modulator 1401 and an off-chip waveguide detector 1402 with total dimensions of approximately 200-300 μm by approximately 100-200 μm, but the dimensions can be varied depending on the implementation. The off-chip waveguide modulator 1401 comprises four waveguide-microring systems 1403-1406. Each of the waveguide-microring systems 1403-1406 includes a portion of an off-chip waveguide and 64 microrings. The waveguides of the waveguide-microring systems 1403-1406 are photonically coupled to an on-chip waveguide 1407 via four beam splitters 1408-1411, respectively. The waveguide 1407 carries 64 unencoded channels that are placed by the beam splitters 1408-1411 into the waveguide-microring systems 1403-1406 which are then used to encode data into the 64 unencoded channels generated by four corresponding tiles, as described below with reference to FIG. 15A. The off-chip waveguide detector 1402 comprises four waveguide-microring systems 1412-1415 that also include four off-chip waveguides for receiving encoded channels from external devices, such as off-chip memory. The waveguide-microring systems 1412-1415 are used to convert the encoded channels into corresponding encoded electrical signals that are transmitted to four electronically couple tiles.

Figure 15:
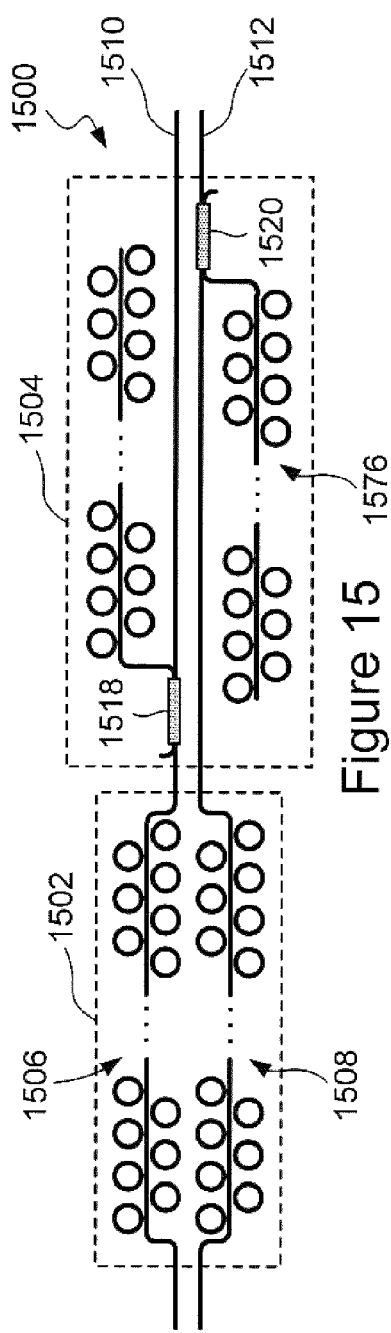
FIG. 15 shows a broadcast in accordance with embodiments of the present invention.

FIG. 15 shows a broadcast system 1500 in accordance with embodiments of the present invention. The broadcast 1500 comprises a broadcast modulator 1502 and a broadcast detector 1504 with area dimensions of approximately 400-600 μm by 20-40 μm, but the dimensions can be varied depending on the implementation. The broadcast modulator 1502 comprises two waveguide-microring systems 1506 and 1508 that are photonically coupled to two on-chip waveguides 1510 and 1512, respectively. The broadcast detector 1504 comprises two waveguide-microring systems 1514 and 1516 that are photonically coupled to the waveguides 1510 and 1512 via beam splitters 1518 and 1520, respectively. The broadcast system 1500 is used to send data to and receive data from all the other clusters at approximately the same time.

Note that although optoelectronic converter embodiments of the present invention have been described above with reference to FIG. 9-15 for a 64 cluster computational device embodiments of the present invention are not so limited. One skilled in the art will immediately recognize that these embodiments can be scaled up or down to accommodate computational devices having any number of clusters.

Operation of Waveguide-Microring Systems

Figure 16A:
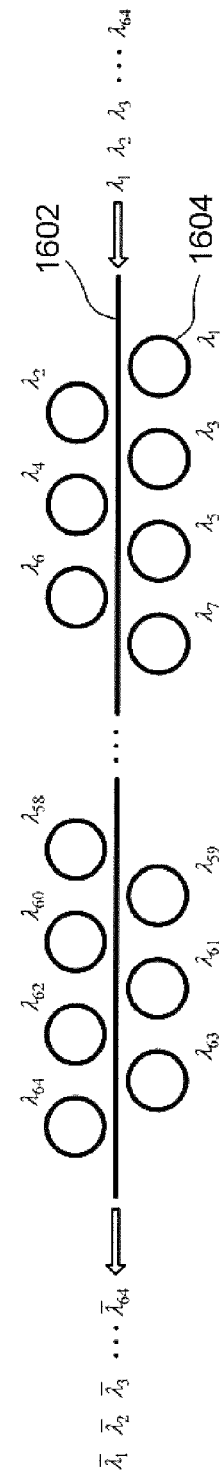
FIG. 16A shows a waveguide-microring system used to encode data in unencoded channels in accordance with embodiments of the present invention.

FIG. 16A shows a waveguide-microring system that can be used to encode data in 64 unencoded channels in accordance with embodiments of the present invention. In FIG. 16A, 64 unencoded (i.e., unmodulated) channels $\lambda_1, \lambda_2, \lambda_3, \ldots, \lambda_{64}$ are carried by a waveguide 1602. Each of the 64 microrings is configured to have resonance with one of the channels so that each channel can be extracted via evanescent coupling into an associated adjacent microring. For example, microring 1604 is configured to be resonant with the channel $\lambda_1$. As the channel $\lambda_1$ is transmitted along the waveguide 1602, much of the channel $\lambda_1$ is evanescently coupled into the microring 1604. Information can be encoded in the intensities of channels by applying a pattern of "on" and "off" voltages to the microrings. The voltage shifts the refractive index of the microrings, which, in turn, modulates the intensity of a channel transmitted along the waveguide 1602. The pattern of voltages may correspond to a string of data output from a corresponding tile in the memory-controller die 104. For example, an appropriate "on" voltage produced by a tile of the memory-controller die 104 may correspond to the binary number "1," and the "off" voltage may correspond to the binary number "0." When the "on" voltage is applied to a microring, the resonance of the microring is shifted and the corresponding channel transmitted along the adjacent waveguide is not evanescently coupled into the microring. In other words, while the "on" voltage is applied, the intensity of the channel remains relatively unchanged as the channel passes the microring. However, as soon as the voltage is turned "off," the channel is evanescently coupled into the microring and the intensity of the channel passing the microring drops. As a result, the same data encoded in a pattern of "on" and "off" voltages can be encoded in the intensity of the channel where relatively high intensities correspond to the binary number "1" and relatively low intensities correspond to the binary number "0."

Figure 16B:
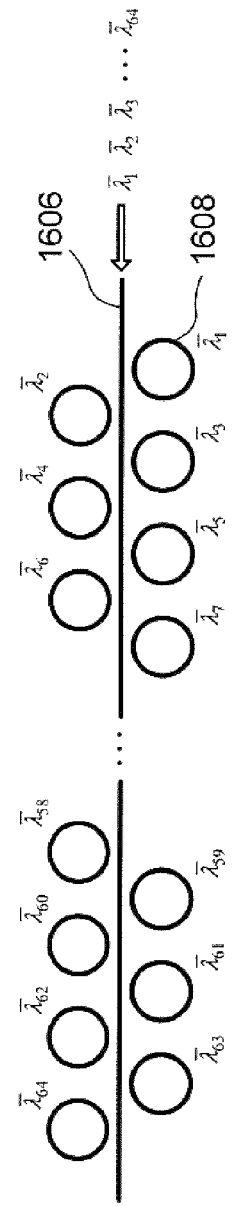
FIG. 16B shows a waveguide-microring system used to extract encoded channels from a waveguide in accordance with embodiments of the present invention.

FIG. 16B shows a waveguide-microring system that can be used to extract 64 encoded channels from a waveguide in accordance with embodiments of the present invention. In FIG. 16B, 64 encoded channels $\bar{\lambda}_1, \bar{\lambda}_2, \bar{\lambda}_3, \ldots, \bar{\lambda}_{64}$ are input to a waveguide 1606 of a detector block. Each of the 64 microrings is configured to have resonance with one of the 64 channels so that each channel can be extracted via evanescent coupling into an adjacent microring. For example, as the encoded channel $\bar{\lambda}_1$ is transmitted along the waveguide 1606, high and low intensity associated with the channel $\bar{\lambda}_1$ are evanescently coupled into a microring 1608. The pattern of relatively high and low intensities associated with the channel $\bar{\lambda}_1$ creates a corresponding pattern of high and low voltages across the microring 1608. This pattern of voltages is then transmitted as an electrical signal encoding the same information to an associated tile in the memory-controller die 104.

Microrings

Figure 17:
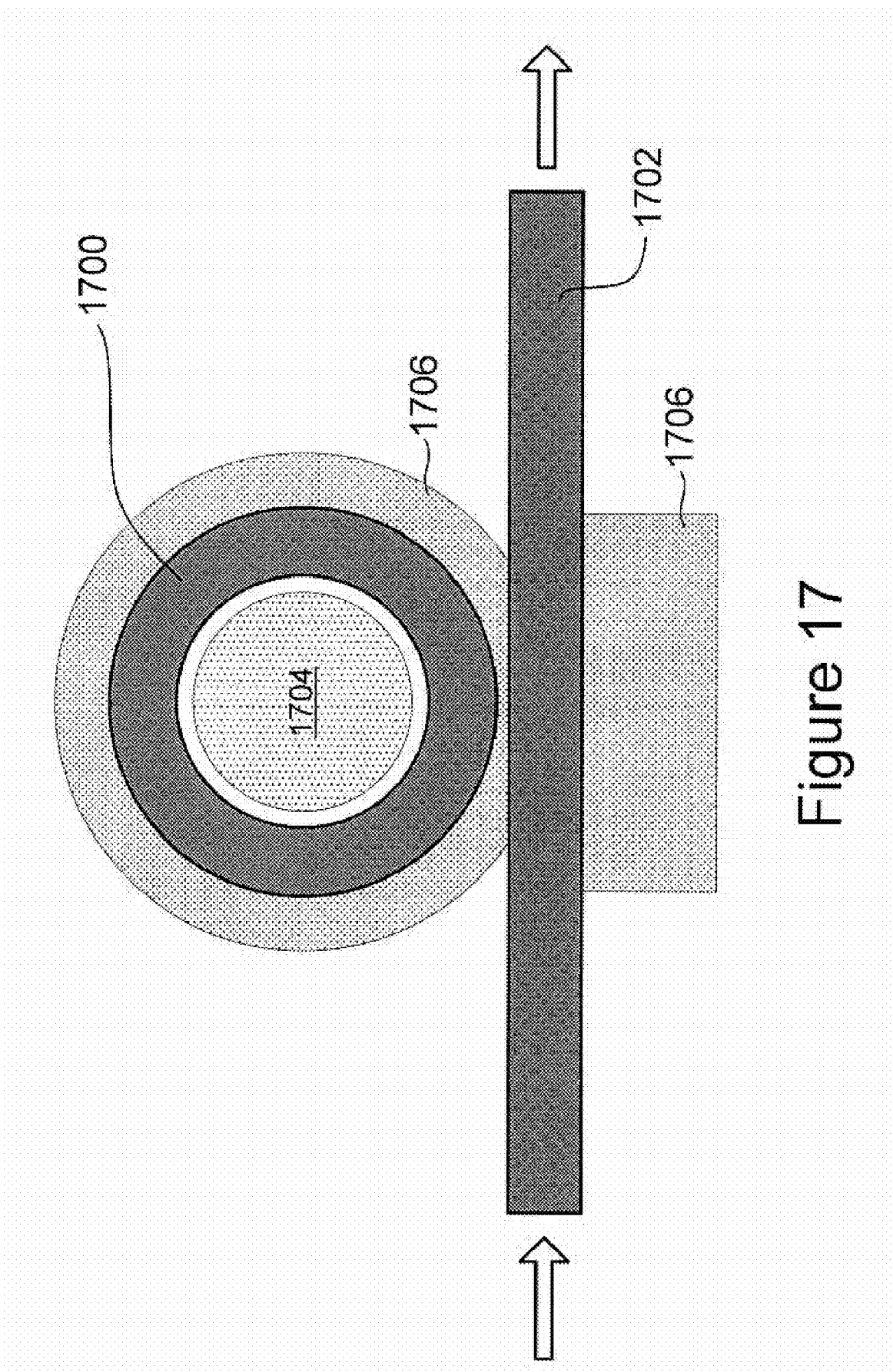
FIG. 17 shows a schematic representation of a microring in accordance with embodiments of the present invention.

FIG. 17 shows a schematic representation of a microring 1700 in accordance with embodiments of the present invention. The microring 1700 is positioned in close proximity to a waveguide 1702. In certain embodiments, the microring 1700 comprises an intrinsic semiconductor, has a p-type semiconductor region 1704 formed in the semiconductor substrate interior of the microring 1700, and an n-type semiconductor region 1706 formed in the semiconductor substrate surrounding the outside of the microring 1700 and on the opposite side of the waveguide 1702. The regions 1704, 1706, and the microring 1700 form a p-i-n junction that can be used as a photodiode or a modulator, as described above with reference to FIG. 16. The waveguide 1702 can be an on-chip or an off-chip waveguide as described above with reference to FIGS. 13-15. The transmission of the waveguide 1702 may be sensitive to the channel wavelength and may be greatly reduced when the channel is at resonance with the microring 1700 because the channel evanescently couples into the microring 1700. The resonance of the microring 1700 can be modulated electronically by applying an appropriate voltage or current to the regions 1704 and 1706. The microring 1700 can be configured so that when no voltage or current is applied to the microring, a particular channel has resonance with the microring 1700 and evanescently couples into the microring 1700. When an appropriate voltage or current is applied to the microring 1700, the resonance of the microring 1700 is shifted and the same channel propagates through the waveguide 1702 undisturbed. On the other hand, the microring 1700 can also be configured so that when a voltage or current is applied to the microring 1700, a particular channel has resonance with the microring 1700 and evanescently couples into the microring 1700. When the voltage or current is turned "off," the resonance of the microring 1700 is shifted and the same channel propagates through the waveguide 1702 undisturbed. For an example of microring modulators see Q. Xu, et al., "12.5 Gbit/s carrier-injection-based silicon microring silicon modulators," *Optics Express* 15, 430 (2007).

Arbitration

The clusters can operate as resources as well as requesters for other resources. However, it may be the case that two or more clusters request access to the same resource, such as a particular cluster, during the same epoch. Each cluster of the present invention is electronically coupled to a corresponding arbitration system in order to avoid these kinds of conflicts. For the sake of brevity and simplicity, the following description of performing arbitration is described using a schematic representation of an exemplary computational device comprising just four clusters in accordance with embodiments of the present invention. Subsequently, a description of an arbitration system embodiment is described below with reference to FIG. 19.

Figure 18A:
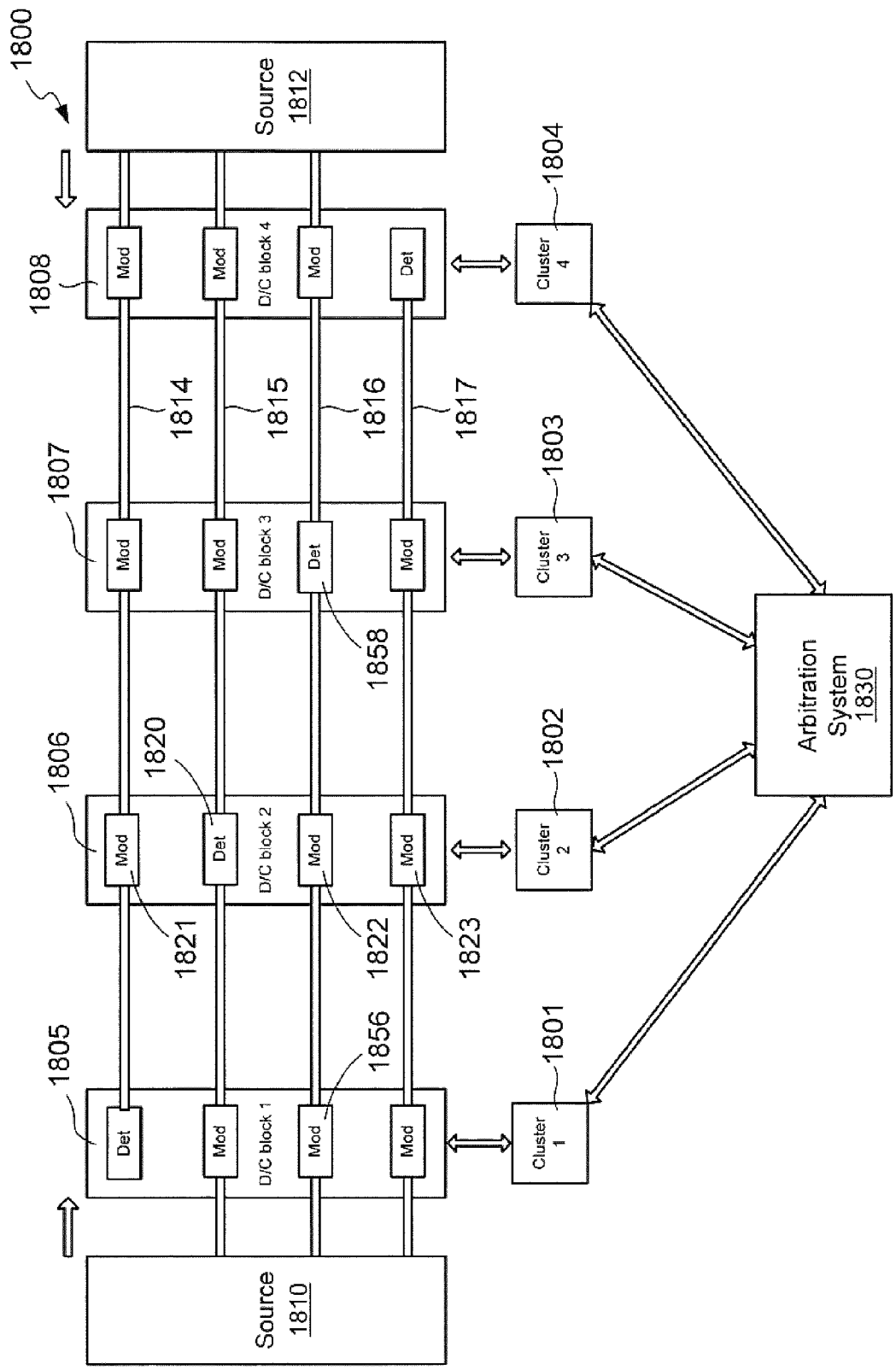
FIG. 18A shows a schematic representation of an exemplary four-cluster, stacked computational device in accordance with embodiments of the present invention.

FIG. 18A shows a schematic representations of an exemplary four-cluster, stacked computational device 1800 in accordance with embodiments of the present invention. The computational device 1800 includes four clusters 1801-1804 that are in electronic communication with four corresponding data/control blocks 1805-1808. The computational device 1800 also includes a first source 1810 and a second source 1812. The sources 1810 and 1812 can be configured to emit 64 unencoded channels $\lambda_1, \lambda_2, \lambda_3, \ldots, \lambda_{64}$ onto each waveguide of the four bundles of waveguides 1814-1817, as described above with reference to FIG. 8. The data/control blocks each receive data and control channels on a particular bundle and use the remaining channels to send data and control channels to the other clusters. For example, the data/control block 1806 includes a bundled waveguide demodulator 1820 and three bundled waveguide modulators 1821-1823 that are configured and operated as described above with FIGS. 11-12. The clusters 1801-1804 are each in electronic communication with an arbitration system 1830.

Figure 18B:
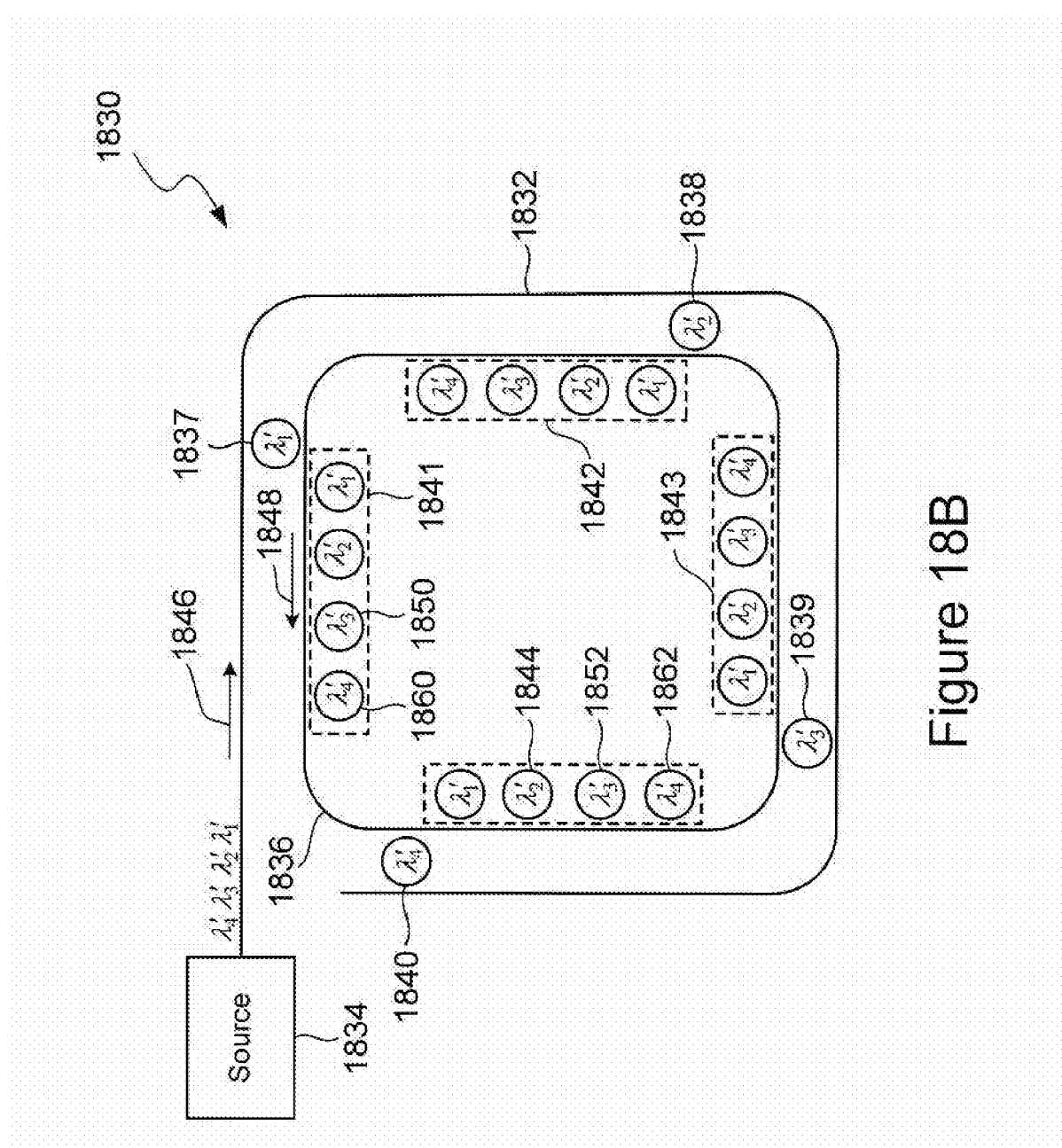
FIG. 18B shows a schematic representation of an arbitration system, shown in FIG. 18A, in accordance with embodiments of the present invention.

FIG. 18B shows a schematic representation of the arbitration system 1830 in accordance with embodiments of the present invention. The arbitration system 1830 comprises a power waveguide 1832 photonically coupled to a source 1834, a loop waveguide 1836 in photonic communication with the power waveguide 1832, and via four light diverters which in this embodiment are wavelength selective elements 1837-1840. In this exemplar discussion, the wavelength selective elements are implemented as microrings. The source 1834 is a source of light. Examples of sources of light include a laser source, a light diode or light received from another system. The arbitration system 1830 also includes 4 groups of 4 interior microrings 1841-1844 located within the loop waveguide 1836. The source 1834 emits four unmodulated channels $\lambda'_1, \lambda'_2, \lambda'_3,$ and $\lambda'_4$ onto the power waveguide 1832. Each of the microring groups 1841-1844 is in electronic communication with one of the four clusters 1801-1804. In particular, the microrings of the microring group 1841 are in electronic communication with the cluster 1 1801, the microrings of the microring group 1842 are in electronic communication with the cluster 2 1802, the microrings of the microring group 1843 are in electronic communication with the cluster 3 1803, and the microrings of the microring group 1844 are in electronic communication with the cluster 4 1804. The interior microrings are configured as p-i-n junction photodiodes, as described above with reference to FIG. 17. Note that for the 64-cluster computational device 100, there is no need for a separate source 1834, as described below with reference to FIG. 19.

As shown in FIG. 18B, the four microrings 1837-1840 and the interior microrings 1841-1844 are each labeled with the channel designations $\lambda'_1, \lambda'_2, \lambda'_3,$ and $\lambda'_4$. These designations identify the channel each microring has resonance with and can evanescently couple from an adjacent waveguide. For example, the microrings 1837-1844 are each separately configured to have resonance with only one of channels $\lambda'_1, \lambda'_2, \lambda'_3,$ and $\lambda'_4$, respectively. In particular, the microrings 1837-1840 evanescently couple the channels $\lambda'_1, \lambda'_2, \lambda'_3,$ and $\lambda'_4$, respectively, from the clockwise direction 1846 in the Power waveguide 1832 onto the counterclockwise direction 1848 in the loop waveguide 1836.

In the same manner, the inner microrings 1841-1844 also evanescently couple particular channels from the loop waveguide 1836, but the inner microrings must be activated or turned "on" by a corresponding cluster. For example, the microrings 1841 can all be configured to be ½ a mode off of the resonance frequency of the channels $\lambda'_1, \lambda'_2, \lambda'_3,$ and $\lambda'_4$. As a result, the channels $\lambda'_1, \lambda'_2, \lambda'_3,$ and $\lambda'_4$ pass the microrings 1841 undisturbed along the loop waveguide 1836. However, the corresponding cluster 1 1801 can send an appropriate current to activate a particular microring shifting the microring into resonance with an associated channel. The microring can then evanescently couple the channel from the loop waveguide 1836 to resonate within the microring. For example, the cluster 1 1801 can turn "on" the microring 1850 so that the channel is evanescently coupled from the loop waveguide 1836 to resonate within the microring 1850. Unless the other microrings within the group 1841 are turned "on," the channels $\lambda'_1, \lambda'_2,$ and $\lambda'_4$ pass undisturbed.

Using the arbitration system 1830 to determine whether one of the four clusters 1801-1804 is available for receiving data is now described with reference to FIGS. 18A and 18B. Just prior to each epoch, each cluster is assigned one of the four channels emitted from the source 1834, and the clusters 1801-1804 are aware of the cluster-to-channel assignments. These assignments can be random or based on a method that ensures a fair utilization of the clusters and can made during the epoch (in an exemplary implementation ⅓ of an epoch) prior to the start of a new epoch. These cluster-to-channel assignments are used by the clusters to determine which clusters are available for receiving data for further processing. In one embodiment, the channel assignments per epoch can be predetermined initially and stored in a look-up table accessible at each cluster, and computer logic used to update the cluster-to-channel assignments per epoch in accordance with a scheme. An example of such a scheme is a round robin scheme.

In one embodiment, the arbiter is spread over several die. The x-bar connections on the memory controller die 104 determines what to request from the arbiter. The request is conveyed through the analog die 106 to the optical die 108 in which the ring modulators and waveguides sit. The attempt it made on the optical die 108 to divert a channel and that channel is either diverted and detected or not. The resulting electrical signal makes it back down to the x-bar connections which interprets electrical signal as a go or no-go to use the logical channel by sending data to the modulators on the next epoch.

Consider, for example, a cluster-to-channel assignment show in Table I prior to the start of an epoch:

TABLE I

| Cluster No. | Channel |
| --- | --- |
| 1 | $\lambda_1'$ |
| 2 | $\lambda_2'$ |
| 3 | $\lambda_3'$ |
| 4 | $\lambda_4'$ |

As displayed in Table I, the cluster 1 1801 has been assigned the channel $\lambda_1'$, the cluster 2 1802 the channel $\lambda_2'$, and so on. Suppose cluster 1 1801 and cluster 4 1804 both want to use cluster 3 1803 to process data. Returning to FIG. 18B, the cluster 1 1801 turns "on" the microring 1850 and the cluster 4 1804 also turns on the microring 1852. The channel $\lambda_3'$ is evanescently coupled from the power waveguide 1832 via the microring 1839 onto the loop waveguide 1836, where the channel $\lambda_3'$ then propagates along the loop waveguide 1836 in a counterclockwise direction 1848 just after the microring 1839. The microring 1850 extracts the channel $\lambda_3'$ from the loop waveguide 1836 before the channel $\lambda_3'$ can reach the microring 1852. The channel $\lambda_3'$ resonating in the microring 1850 generates an electrical signal that is sent to the cluster 1 1801. Returning to FIG. 18A, when this electrical signal exceeds a threshold, it is detected in the cluster 1 1801. Having detected this signal, the cluster 1 1801 transmits during the subsequent epoch the data to the modulators 1856 which encode the data in unmodulated channels output from the source 1810. These encoded (i.e., modulated) channels are then streamed along the bundle 1816 to the detectors 1858 and processed by the cluster 3 1803, as describe above with reference to FIG. 12. In this particular epoch, the cluster 1 1801 gets access to the cluster 3 1803 and the cluster 4 1804 has to wait for a subsequent epoch.

Now suppose that cluster 1 1801 and cluster 4 1804 both want to again use cluster 3 1803 to process data. But in this case, suppose that the cluster-to-channel assignments are as show in Table II prior to the start of an epoch:

TABLE II

| Cluster No. | Channel |
| --- | --- |
| 1 | $\lambda_3'$ |
| 2 | $\lambda_1'$ |
| 3 | $\lambda_4'$ |
| 4 | $\lambda_2'$ |

As displayed in Table II, the cluster 3 1803 has now been assigned the channel $\lambda_4'$. Returning to FIG. 18B, the cluster 1 1801 turns "on" the microring 1860, and the cluster 4 1804 also turns "on" the microring 1862. The channel $\lambda_4'$ is evanescently coupled from the power waveguide 1832 via the microring 1840 onto the loop waveguide 1836, where the channel $\lambda_4'$ then propagates along the loop waveguide 1836 in the counterclockwise direction 1848 just after the microring 1840. However, prior to this epoch, the microring 1862 extracts the channel $\lambda_4'$ from the loop waveguide 1836 before the channel $\lambda_4'$ can reach the microring 1860. The channel $\lambda_4'$ resonates in the microring 1862 and generates an electrical signal that is sent to the cluster 4 1804. Now returning to FIG. 18A, when this electrical signal exceeds a threshold, the cluster 4 1804 detects this signal. Having detected this signal, cluster 4 1804 transmits during the subsequent epoch the data to the cluster 3 1803 for processing as described above. In this particular epoch, the cluster 4 1804 gets access to the cluster 3 1803 and the cluster 1 1801 has to wait for a subsequent epoch.

Figure 19:
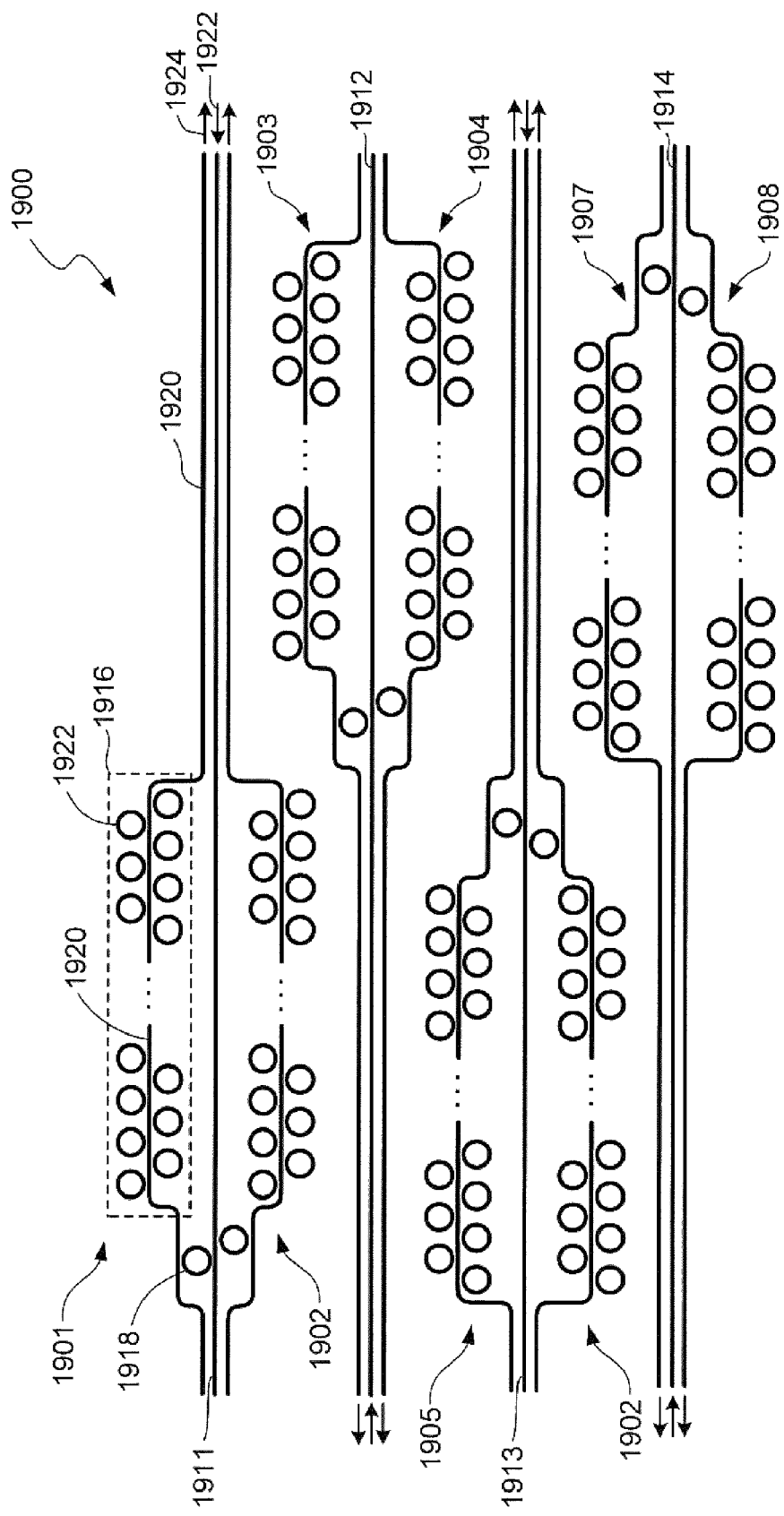
FIG. 19 shows an arbitration system in accordance with embodiments of the present invention.

FIG. 19 shows an arbitration system 1900 corresponding to an associated cluster N in accordance with embodiments of the present invention. The arbitration system comprises eight arbiters 1901-1908. Each arbiter comprises a waveguide-microring system and a microring that is photonically coupled to one of four central waveguides 1911-1914. For example, the arbiter 1901 comprises a waveguide-microring system 1916 and a microring 1918 photonically coupled to the central waveguide 1911. The arbiter 1901 can be used by the cluster N to determine whether a requested cluster M is available for receiving data, and other arbiters (not shown) connected to the same waveguide 1920 do the same for their associated clusters.

For the sake of simplicity, assume that the arbitration system 1900 represents one of the 64 arbitration systems of the computer device 100, such as the arbitration system 1006, shown in FIG. 10. Assume that all 64 clusters use the arbiters connected to the waveguide 1920 to determine which cluster is available for receiving data. A source, such as the sources 702 or 704, places the 64 channels $\lambda_1, \lambda_2, \lambda_3, \ldots, \lambda_{64}$ into the waveguide 1911 in the direction 1922. Each arbiter includes a microring, such as microring 1918, that extracts one of the channels $\lambda_1, \lambda_2, \lambda_3, \ldots, \lambda_{64}$ from the power waveguide 1911 and places the corresponding channel onto the waveguide 1920 to propagate in the direction 1924. For example, the microring 1918 can be configured to extract the channel $\lambda_N$ from the power waveguide 1911. The 64 microrings of the waveguide-microring system 1916 are each configured to extract one of the 64 unmodulated channels $\lambda_1, \lambda_2, \lambda_3, \ldots, \lambda_{64}$ carried by the waveguide 1920 when an appropriate current is applied. Now suppose the cluster N wants to send data to the cluster M to be processed during the next epoch. During that last ⅓ of the previous epoch, the cluster N determines that cluster M has been assigned the channel $\lambda_{63}$ in the cluster-to-channel assignment. The cluster N responds by turning "on" the microring 1922. Because the microring 1918 is configured to extract only the channel $\lambda_N$, the channel $\lambda_{63}$ is extracted from the power waveguide 1911 by a different arbiter (not shown) connected to the waveguide 1920 and the channel $\lambda_{63}$ is transmitted back along the waveguide 1920 in the direction 1924. Provided the channel $\lambda_{63}$ is not intercepted by an arbiter of cluster that would also like to use cluster M to process data, the channel $\lambda_{63}$ is extracted via evanescent coupling into the microring 1922 which generates an electrical signal above threshold. The cluster N responds by transmitting data to the cluster M as described above with reference to FIG. 12. If the channel $\lambda_{63}$ is extracted by another cluster K before the channel $\lambda_{63}$ reaches the microring 1922, then the cluster K can transmit data to the cluster M for processing, and the cluster N waits for next cluster-to-channel assignment and the next epoch.

Note that although the operation of one of the eight arbiters 1901-1908 has been described, a number of the other arbiters can be used to determine whether other clusters are available and can be used to determine whether external devices are available. These determinations can be made at different times during an epoch.

As discussed above, in addition to the illustrative example of a multi-core computational device, the photonic interconnect and arbitration system embodiment can be implemented in other computer system devices, for example a memory system device which can also have the three-dimensional stacking and multiple memory controllers.

The all-optical arbitration system embodiment discussed above in the context of FIG. 18A to FIG. 19 illustrates a system combining arbitration with power delivery and also illustrates a changing or non-fixed assignment of logical optical channels associated with the different resources, e.g. clusters in the computer system device. This provides fairness as discussed above.

Figure 20A:
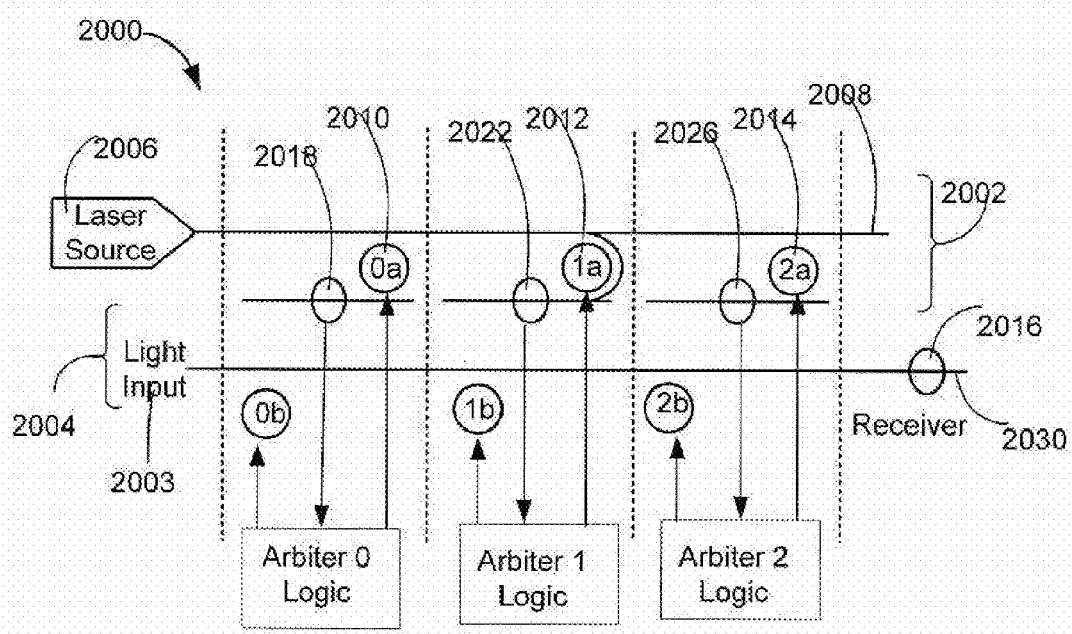
FIG. 20A illustrates a schematic view of an all-optical arbitration system in accordance with another embodiment of the present invention in which the priority scheme is fixed (not fair).

FIG. 20A illustrates a schematic view of an all-optical arbitration system in accordance with another embodiment of the present invention in which the priority scheme is fixed (not fair). The arbitration system 2000 may be a portion of a photonic interconnect or may be applicable to the entire portion of an optical interconnect. An exemplar arbitration optical portion 2002 is shown as well as a data path optical portion 2004 which is illustrated as well to show the relative position of an optical receiver 2016 associated with the recipient computer system component to which data is requested to be sent a time period window, (e.g. epoch). In this example, the data portion has its own light input to be modulated with the data to be sent from the arbitration winning associated computer system component to the desired recipient component associated with 216. The light input 2003 can be a portion of light diverted or split off from the signal produced from laser source 2006 in which case the light input would be unmodulated. However, the light power 2003 for the data path optical portion 2004 is not received or delivered from a light diverter (e.g. "0a", "1a" or "2a") associated with the arbitration system.

A laser source 2006 provides power as light along a power waveguide 2008. Each of the light diverters 0a, 1a, 1b couple light from the power waveguide 2008 when allowed in accordance with an arbitration scheme or protocol. For this example, a zeroth light diverter 0a is closest to the optical path from the laser source 2006, a first light diverter 1a is the next closest to the optical path for the laser source 2006, and a second light diverter 2a is optically furthest from the laser source 2006. The arbitration system 2000 is represented by an arbitration portion 2002 which includes the light diverters 0a, 1a and 2a as well as respective detectors including a zeroth detector 2018 coupled between the zeroth light diverter 0a and arbiter 0 logic, a first detector 2022 coupled between the first light diverter 1a and arbiter 1 logic, and a second detector 2026 coupled between the second light diverter 2a and arbiter 2 logic. Each of the arbiter logic units is associated with a computer system component of the computer system device. In one embodiment, the light diverter (0a, 1a, 2a) can be a passive optical tap or a passive optical splitter to which the respective optical detector (2018, 2022, 2026) is coupled to receive any diverted light.

Each of the light diverters can also be implemented as a wavelength selective element such as a ring modulator, as in the multi-core example presented above. The additional detectors 2018, 2022 and 2026 may not be needed when the light diverter ring modulator can generate its own electrical notification signal as well. If any of the computer system components associated with light diverters 0a, 1a and 2a has a request to transmit a signal to the component associated with receiver 216, the arbiter logic (0, 1, 2) of the associated computer system component sends an activation signal its respective ring modulator light diverter 0a, 1a and 2a. In the illustrated example, Arbiter 1 activates light diverter 1a which diverts light from the laser source 2006 to the first detector 2022 which sends an electrical signal notifying arbiter 1 logic that diverter 1a successfully diverted the light from the power waveguide 2008 and that the component 1 can send its data on the next designated time period (e.g. epoch) to the component associated with optical receiver 2016. Another type of modulator which can be used is a channel agile modulator.

The arbiter 1 logic can notify a requesting component (e.g. a memory controller or core or network interface) that its request can be satisfied next. The arbiter 1 logic can activate modulator 1b for encoding of the request or requested data onto an optical signal of the light input 2003 for sending onto a data waveguide 2030 in one or more wavelength channels that can make up a logical channel that can be received by optical receiver 2016. In this example, the light from the laser source 2006 can be modulated (.e.g. a notification of winning the arbitration) as it is not being used as a power source outside of the arbitration system portion 2002. Standalone arbitration where power delivery is not coupled with the arbitration light source can support instances where one arbitration can lead to multiple waveguides or logical channels being used. The specific wavelength or wavelengths used for the arbitration signals represent that a logical channel is available but not that a recipient component needs to communicate on those same specific wavelengths.

In this example, computer system component 1 has won the arbitration. The diversion of light by light diverter 1a also prevents the light from laser source 2006 from reaching light diverter 2a. The arbiter 2 logic determines it still has not been granted access and must wait at least for the next designated time period in order to send its data. This example exemplifies that the arbitration system 2000 has a fixed priority arbitration scheme and it is not necessarily fair in that component 0 always takes priority over component 1 which in turn always take priority over component 2 in being given access to the component associate with optical receiver 2016.

FIG. 20A (and 20B below) illustrate three examples of arbitration modules including optical arbitration modules. Each arbitration module includes an arbiter logic unit (arbiter 0, 1, and 2) through which a set of computer system components can interact for access to the photonic interconnect, and the associated optical arbitration module that can divert light from the power waveguide 2008 to indicate access has been granted in accordance with an arbitration scheme.

Figure 20B:
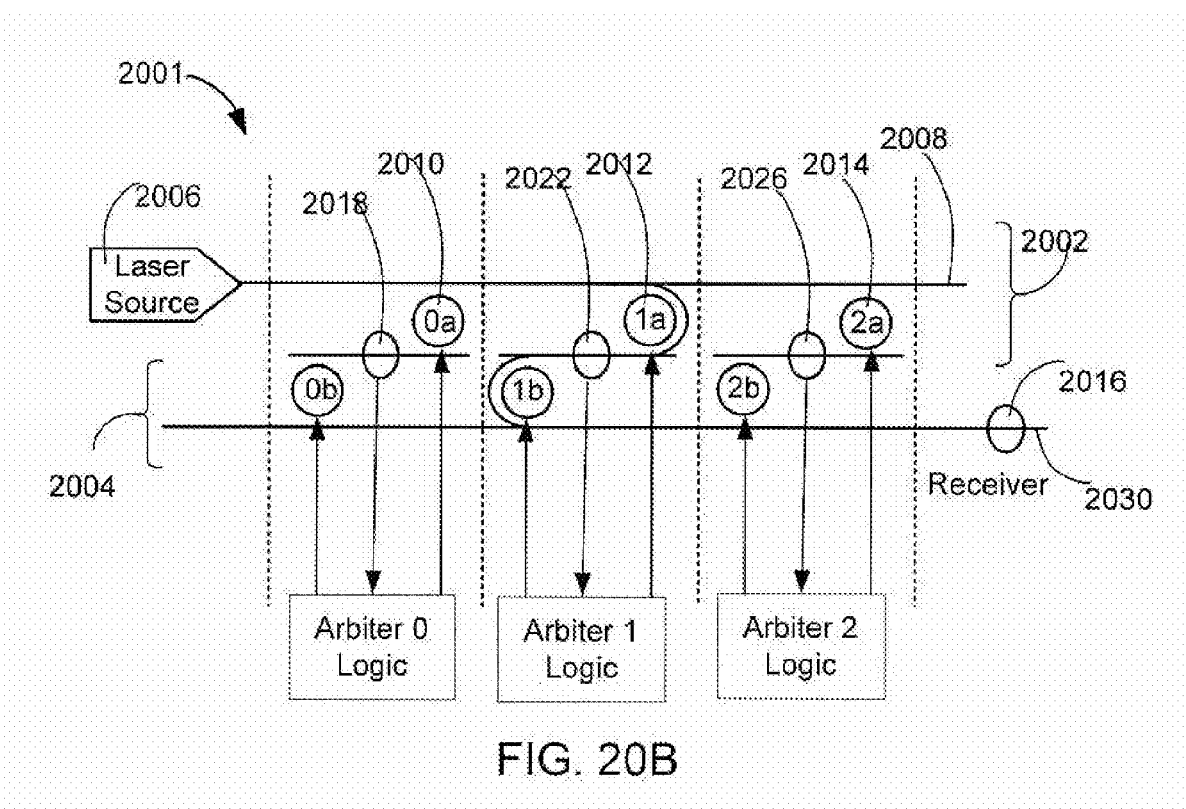
FIG. 20B illustrates another version of an arbitration system embodiment in which light power delivery to another functional portion of the photonic interconnect such as data transport is coupled or combined with arbitration.

FIG. 20B illustrates another version 2001 of an arbitration system embodiment in which light power delivery to another functional portion of the photonic interconnect such as data transport is coupled or combined with arbitration. In which modulators "0b", "1b" and "2b" are positioned to receive unmodulated light power from laser 2006 that has been diverted by light diverters 0a, 1a and 2a respectively. The data or request from the computer system component granted access is encoded onto the unmodulated light for transport on the allocated photonic interconnect data channel or channels won in the arbitration on waveguide 2030.

For ease of illustration, the arbitration channel or channels is depicted as traversing a separate waveguide from the data channel portion of the photonic interconnect. However, the wavelengths making up the arbitration and data channels can be wavelength divisioned multiplexed and can be carried by the same optical waveguide.

Figure 21:
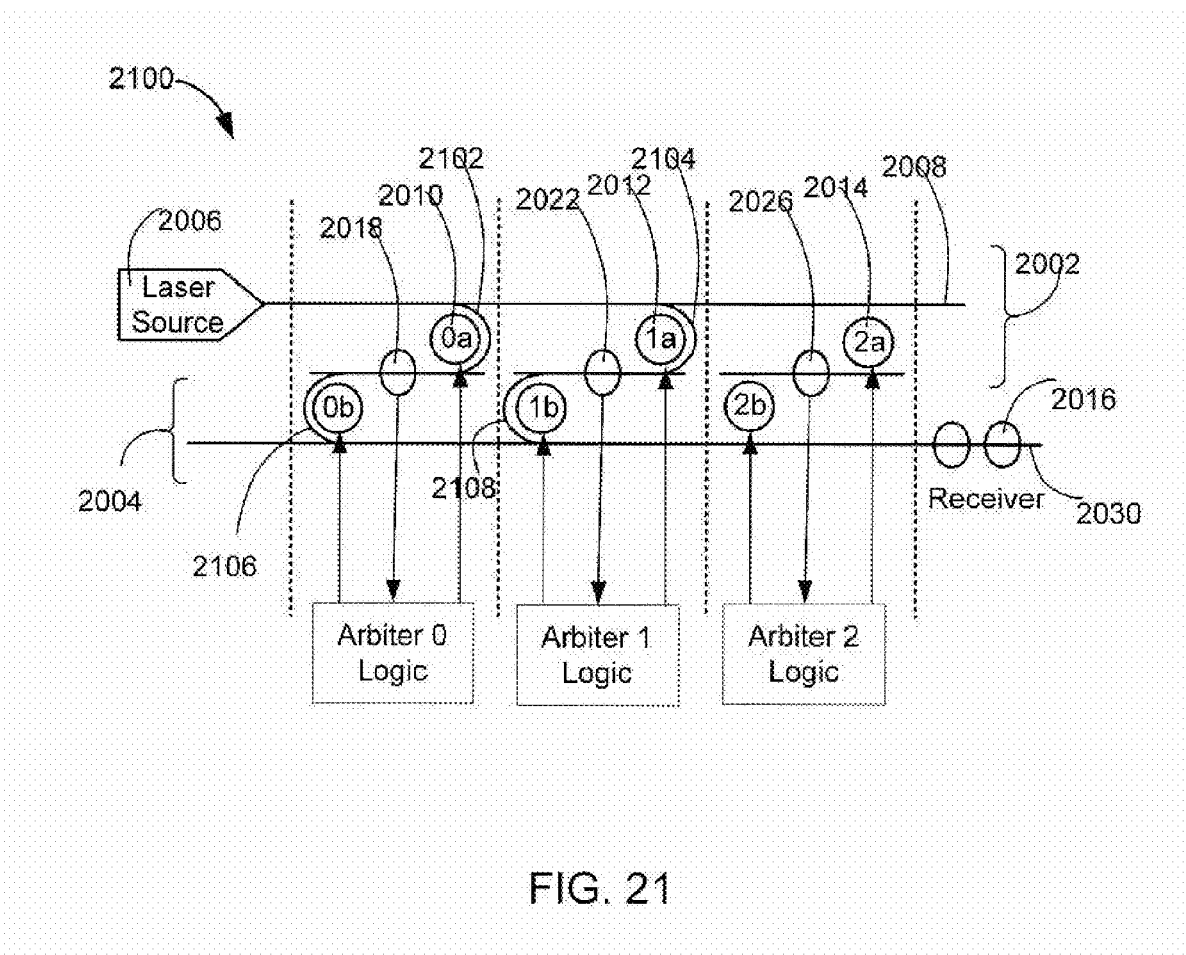
FIG. 21 is a schematic view of the arbitration system which can employ an arbitration scheme in which multiple computer system components can be granted access to multiple receiving components without increasing a number of waveguides used.

FIG. 21 is a schematic view of the arbitration system 2001 which can employ an arbitration scheme in which multiple computer system components can be wanted access to multiple receiving components without increasing a number of waveguides used.

In this example, the laser source 2006 not only delivers unmodulated light power as described in FIG. 20B but outputs unmodulated light of discrete wavelengths which are wavelength division multiplexed (WDM) or dense wavelength division multiplexed (DWDM). The zeroth light diverter 0a, the first light diverter 1a, and the second light diverter 2a may be each implemented with a tunable modulator (e.g. channel agile modulator) or a bank of fixed modulators (e.g. ring modulators). Similarly, the zeroth modulator 0b, the first modulator 1b, and the second modulator 2b may be each implemented with a tunable modulator or a bank of fixed modulators. The receivers 2016 are preferably fixed frequency receivers.

In this case, if a component wants to communicate with a particular receiver, the respective arbiter logic tunes its respective diverter and its respective modulator, in parallel if speed is important or sequentially if there are constraints on power or reliability, to the wavelength corresponding to the receiver. This scheme allows components to arbitrate for multiple receivers without increasing the number of waveguides.

As a more detailed description of this example, the zeroth light diverter 0a diverts a zeroth wavelength unmodulated light 2102 from the power waveguide 2008 and the first light diverter 1a diverts a first wavelength unmodulated light 2104. The zeroth detector 2018 and the first detector 2022 detect successfully arbitration for their respective associated components. The zeroth modulator 0b and the first modulator 1b may receive the zeroth wavelength unmodulated light 2102 and a first wavelength unmodulated light 2104, respectively, and output a zeroth wavelength modulated light 2106 and a first wavelength modulated light 2108, respectively, onto the data waveguide 2030.

Figure 22:
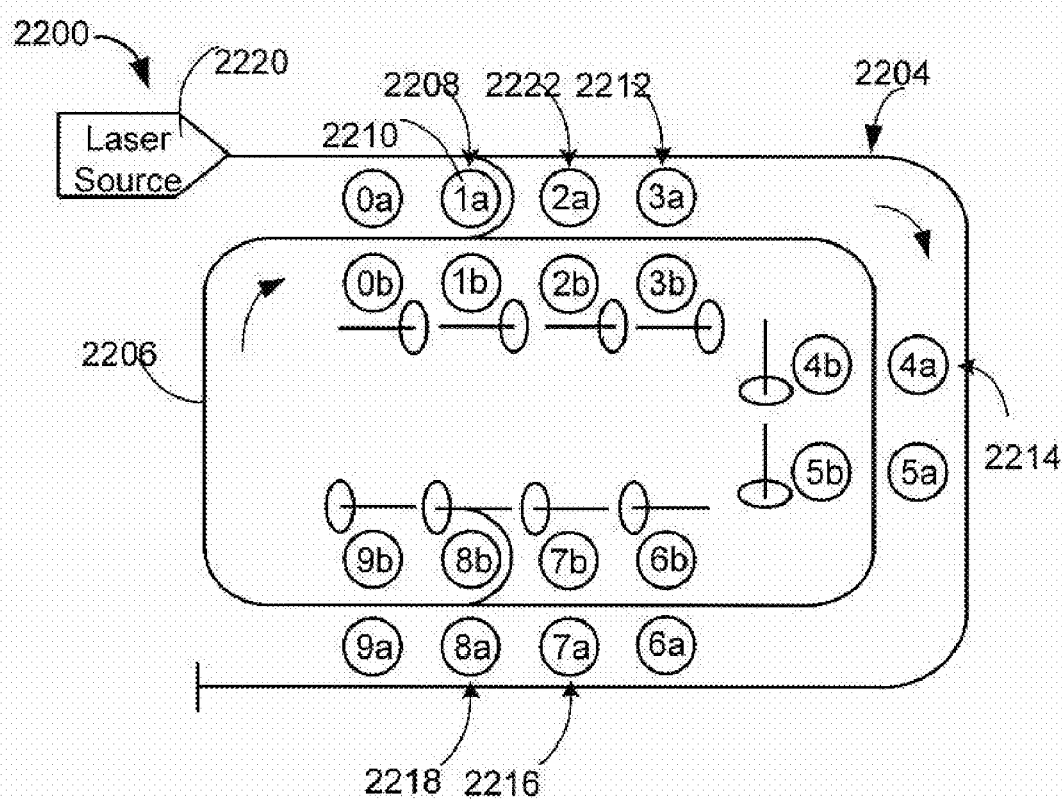
FIG. 22 shows a schematic view of another arbitration system in accordance with an embodiment of the present invention.

Referring now to FIG. 22, therein is shown a schematic view of another arbitration system 2200 in accordance with an embodiment of the present invention. Arbitration protocols have several properties that can be traded off and optimized, including simplicity, speed, centralized versus distributed, fairness, and prioritization. As described in FIG. 20A, the arbitration system 2000 of FIG. 20A has a fixed priority and thus it is not fair.

The arbitration system provides an optically implemented token protocol. In this example, there are ten modules 0 through 9 trying to arbitrate for a single resource. The concept of a token is represented by the fact that the modules have the ability to divert the light from a power waveguide 2204 onto an arbitration waveguide 2206, and which one of the modules diverts the light can change between arbitrations. By changing the priority each time, the arbitration occurs in a way such that every one of the modules has the same average priority resulting in an arbitration mechanism that is fair.

In the arbitration system 2200, a first module 2208 diverts the light from the power waveguide 2204 to the arbitration waveguide 2206 using a first light diverter 2210 depicted as "1a". The first light diverter 2210 may be implemented with a ring modulator. Arbitration on the arbitration waveguide 2206 occurs in a similar manner described in FIG. 20A.

In this example, a third module 2212, a fourth module 2214, a seventh module 2216, and an eighth module 2218 are depicted as modules 3, 4, 7, and 8, respectively, attempt to divert the light from the arbitration waveguide 2206. The eighth module 2218 successfully diverts the light and detects it because the light passes by it first and thereby wins the arbitration and the right to use the resource. The notation of first, third, fourth, seventh, and eighth represents the proximity of the modules 2202 to a laser source 2220 driving the power waveguide 2204 where the lower number is optically closer to the laser source 2220.

At the beginning of the next arbitration phase, a module other than the first module 2208 or module 1 will divert the light onto the arbitration waveguide 2206 thereby changing the priority for that round. Which module diverts the light next depends on the protocol desired. One possible arbitration scheme is a simple round robin scheme where the highest priority just cycles through each module in turn.

In the round robin scheme, a second module 2222 depicted as module 2 would divert the light in the next phase, followed by the third module 2212 or module 3 in the following phase and so on. When a plurality of wavelengths are multiplexed on the power waveguide 2206, a particular wavelength or group of wavelengths can be diverted at each module in a round robin scheme as well. For example, if there are ten wavelengths, the first wavelength can be diverted by module 0a in an initial first epoch. In the next epoch, only module 2208 (1a) can activate its light diverter to divert the first wavelength. The arbitration can still be distributed as each module only needs to know which epoch it is via a synchronous clock signal those epochs during which it has access to different wavelengths which can be store locally by the arbiter logic. The arbitration module docs not need to know which module was granted access previously, thus keeping arbitration distributed, rather requiring global communication within the computer system device. By changing the priority every round in this manner, fairness can be improved considerably over a fixed priority scheme described for the arbitration system 2000 of FIG. 20A. Another arbitration scheme for the arbitration system 2200 may include that the priority is rearranged such that the current holder of the resource becomes the lowest priority module in the next arbitration cycle. However, this does introduce global information exchange requirements.

Light does not travel instantaneously, so there are timing considerations that must be taken into account in these schemes. When a new phase begins, the new diverter might have to wait for the light to arrive on the power waveguide. Additionally, a module needs to be certain that it uses light from the current diverter, not light left over from the previous phase.

In the round robin scheme, where each phase has the next higher module become the diverter (and wrapping back to 0 from the highest numbered module), a module must wait for the light to travel on the power waveguide 2204 to the next diverter, and then wait for the time of one full transit of the ring in the case where the winner is as far away from the diverter as possible. One full transit is also the amount of time required to ensure that each of the modules 2202 sees light from the new phase and not the previous one.

If there are N modules and N arbiters (either implemented through replication or WDM), and if in every phase, all N modules wish to transmit to a receiver chosen in a uniform random distribution, this scheme will approach a utilization of $1-e^{-1}$ (approx. 0.632) as N increases. We can improve the utilization by performing several rounds of arbitration, where each round arbitrates among the losers of the previous round. If there are R rounds, the utilization as N increases will approach $1-e^{-R}$.

As described above, the token protocol does not combine power delivery and arbitration as described above. This could be done by adding another set of modulators and another waveguide in the middle between the power waveguide 2204 and the arbitration waveguide 2206. If the arbitration waveguide 2206 in FIG. 22 functioned as the power waveguide 2008 of FIG. 20B, and there were a ring modulator with each detector to transfer the light onto the data waveguide 2030 of FIG. 20B, this would result in a combined power delivery and token arbitration protocol.

The optical power required to implement these arbitration protocols could be considerably less than an electrical implementation, especially if done over long distances or done at very high speeds. Furthermore, depending on the size of the ring of the arbitration waveguide 2206, this solution has the potential to arrive at a decision in a very short amount of time. An on-chip ring could arrive at a decision in just a few nanoseconds compared to electrical solutions that are often an order of magnitude or slower.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. An optical arbitration system for arbitrating requests for access to time-limited resources from resource requestors in a computer system, the system comprising:
   a waveguide;
   a light source for sending tokens of light in different wavelength channels over the waveguide, wherein each token of light represents availability of an associated one of the resources for a particular period; and
   for each of the resource requestors,
      an associated light diverter coupled with the waveguide for diverting respective ones of the tokens of light,
      associated detectors for respectively detecting respective ones of the tokens of light diverted by the associated light diverter, wherein each token of light can be detected by only a single detector;
   wherein for each period
      each of the wavelength channels is uniquely assigned to respective ones of the resources;
      each of one or more of the resource requestors bids for access to a respective one of the resources by activating the respectively associated light diverter, and
      when two or more of the resource requestors bid for access to a particular one of the target resources, a particular one of the two or more resource requestors obtains exclusive access to the particular target resource based on detection of the token on the wavelength channel currently assigned to the particular resource by a respective one of the detectors associated with the particular resource requestor.

2. The system as claimed in claim 1, wherein the waveguide is a power waveguide carrying unmodulated light; and
   further comprising, for each of the resource requestors, associated modulators that are coupled to the respectively associated detectors for modulating light from the light source.

3. The system as claimed in claim 1, wherein each of the light diverters includes a respective ring modulator.

4. The system as claimed in claim 1, wherein the light diverters are coupled to different locations along the waveguide.

5. The system as claimed in claim 1, wherein:
   the light source sends unmodulated light in the different wavelength channels; and
   the light diverters are operable to divert the unmodulated light sent in the different wavelength channels.

6. The optical arbitration system as claimed in claim 1, wherein the wavelength channels are assigned to respective ones of the resources according to a fixed priority arbitration scheme.

7. The optical arbitration system as claimed in claim 1, wherein the wavelength channels are assigned to respective ones of the resources according to a non-fixed priority arbitration scheme.

8. The optical arbitration system as recited in claim 1, wherein the resources and the resource requesters are computer system components.

9. The optical arbitration system as recited in claim 1, wherein the resources are respective communication channels of a communications system.

10. The optical arbitration system as recited in claim 1, further comprising arbitration logic for assigning the wavelength channels to respective ones of the resources.

* * * * *